United States Patent
Zi et al.

(10) Patent No.: US 11,215,924 B2
(45) Date of Patent: Jan. 4, 2022

(54) PHOTORESIST, DEVELOPER, AND METHOD OF FORMING PHOTORESIST PATTERN

(71) Applicant: TAIWAN SEMICONDUCTOR MANUFACTURING CO., LTD., Hsinchu (TW)

(72) Inventors: An-Ren Zi, Hsinchu (TW); Ching-Yu Chang, Yilang County (TW); Chin-Hsiang Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 80 days.

(21) Appl. No.: 16/522,135

(22) Filed: Jul. 25, 2019

(65) Prior Publication Data
US 2020/0073238 A1    Mar. 5, 2020

Related U.S. Application Data

(60) Provisional application No. 62/726,015, filed on Aug. 31, 2018.

(51) Int. Cl.
| | |
|---|---|
| *G03F 7/004* | (2006.01) |
| *G03F 7/038* | (2006.01) |
| *G03F 7/039* | (2006.01) |
| *G03F 7/40* | (2006.01) |
| *G03F 7/16* | (2006.01) |
| *G03F 7/20* | (2006.01) |
| *G03F 7/32* | (2006.01) |

(52) U.S. Cl.
CPC .......... *G03F 7/0048* (2013.01); *G03F 7/0042* (2013.01); *G03F 7/038* (2013.01); *G03F 7/039* (2013.01); *G03F 7/168* (2013.01); *G03F 7/2004* (2013.01); *G03F 7/325* (2013.01); *G03F 7/40* (2013.01)

(58) Field of Classification Search
CPC ...... G03F 7/0048; G03F 7/0042; G03F 7/038; G03F 7/039; G03F 7/40; G03F 7/168; G03F 7/2004; G03F 7/325; G03F 7/0043; G03F 7/004
USPC ....................................................... 430/270.1
See application file for complete search history.

(56) References Cited

U.S. PATENT DOCUMENTS

| | | | | |
|---|---|---|---|---|
| 5,876,897 | A | * | 3/1999 | Durham ................ G03F 7/0045 430/170 |
| 8,796,666 | B1 | | 8/2014 | Huang et al. |
| 9,093,530 | B2 | | 7/2015 | Huang et al. |
| 9,213,234 | B2 | | 12/2015 | Chang |
| 9,223,220 | B2 | | 12/2015 | Chang |
| 9,256,133 | B2 | | 2/2016 | Chang |

(Continued)

OTHER PUBLICATIONS

Canet Acikgoz et al., "Polymers in conventional and alternative lithography for the fabrication of nanostructures," European Polymer Journal 47 (2011) 2033-2052.

*Primary Examiner* — Caleen O Sullivan
(74) *Attorney, Agent, or Firm* — McDermott Will & Emery LLP

(57) ABSTRACT

A photoresist composition comprises a polymer resin, a photoactive compound, an organometallic compound, an enhancement additive, and a first solvent. The enhancement additive is an ionic surfactant, a non-ionic surfactant, or a second solvent having a boiling point of greater than 150° C.

20 Claims, 12 Drawing Sheets

(56) References Cited

U.S. PATENT DOCUMENTS

| | | | |
|---|---|---|---|
| 9,536,759 B2 | 1/2017 | Yang et al. | |
| 9,548,303 B2 | 1/2017 | Lee et al. | |
| 9,857,684 B2 | 1/2018 | Lin et al. | |
| 9,859,206 B2 | 1/2018 | Yu et al. | |
| 9,875,892 B2 | 1/2018 | Chang et al. | |
| 2002/0187438 A1* | 12/2002 | Chang | G03F 7/3021 |
| | | | 430/326 |
| 2010/0189964 A1* | 7/2010 | Kitagawa | G03G 15/0194 |
| | | | 428/195.1 |
| 2015/0079393 A1 | 3/2015 | Freedman et al. | |

* cited by examiner

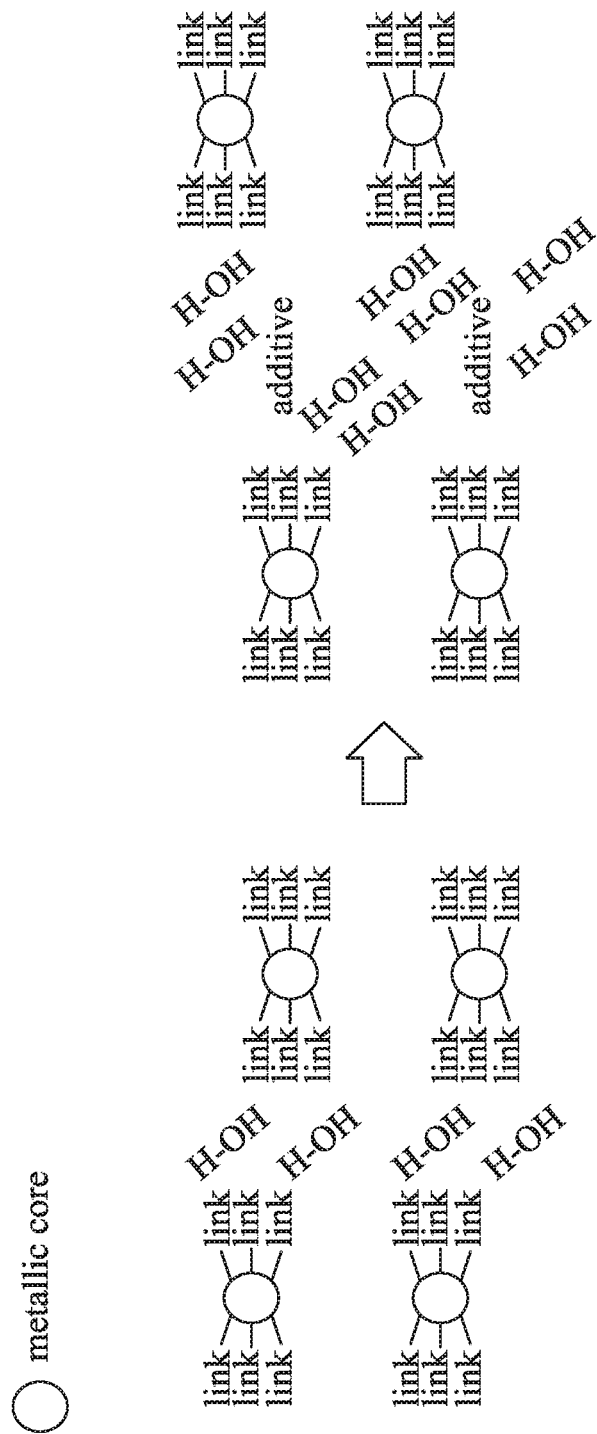

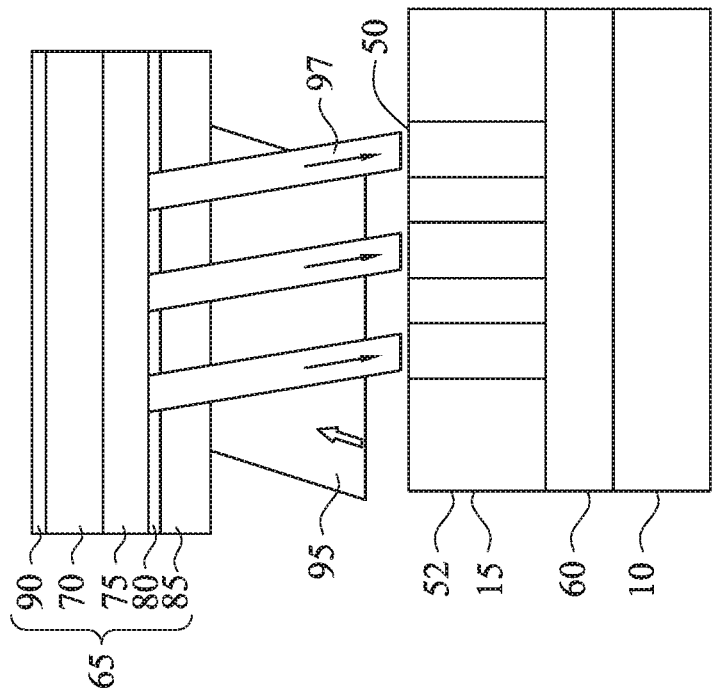
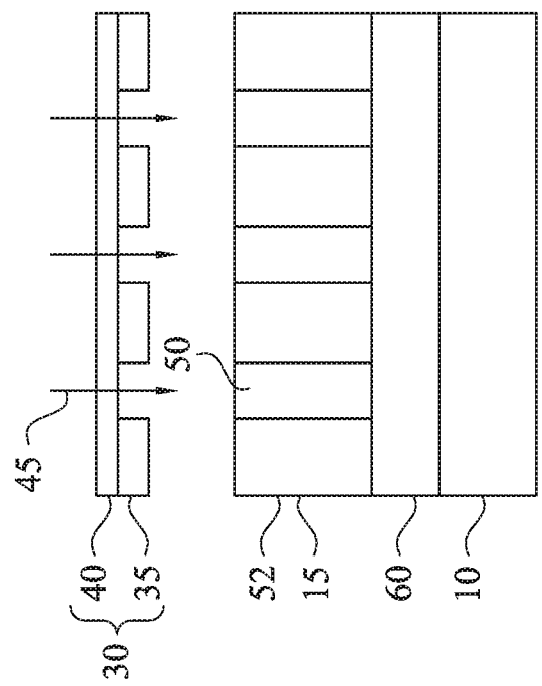
FIG. 9B
FIG. 9A

PHOTORESIST, DEVELOPER, AND METHOD OF FORMING PHOTORESIST PATTERN

CROSS-REFERENCE TO RELATED APPLICATIONS

This application claims priority to U.S. Provisional Patent Application No. 62/726,015, filed Aug. 31, 2018, the entire disclosure of which is incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other, or vice-verse.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

As the semiconductor industry has progressed into nanometer technology process nodes in pursuit of higher device density, higher performance, and lower costs, there have been challenges in reducing semiconductor feature size.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 4 shows the effect of the additive on the photoresist according to some embodiments of the disclosure.

FIGS. 9A and 9B show a process stage of a sequential operation according to an embodiment of the disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
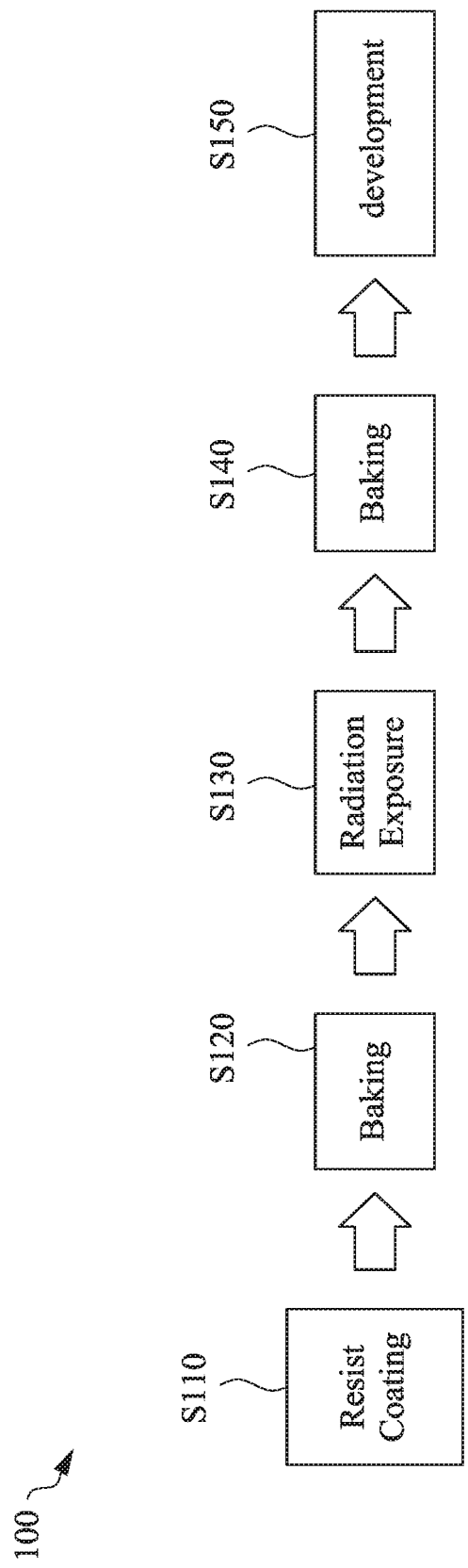
FIG. 1 illustrates a process flow of manufacturing a semiconductor device according to embodiments of the disclosure.
Figure 2:
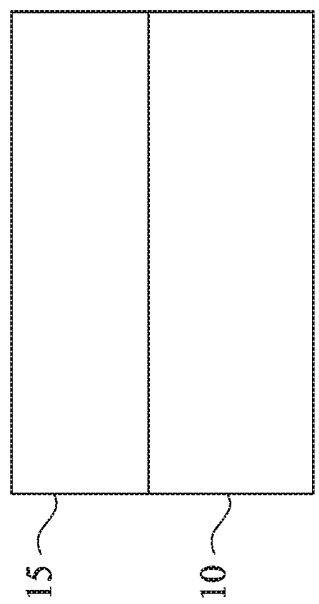
FIG. 2 shows a process stage of a sequential operation according to an embodiment of the disclosure.

FIG. 1 illustrates a process flow 100 of manufacturing a semiconductor device according to embodiments of the disclosure. A photoresist is coated on a surface of a layer to be patterned or a substrate 10 in operation S110, in some embodiments, to form a photoresist layer 15, as shown in FIG. 2. Then the photoresist layer 15 undergoes a first baking operation S120 to evaporate solvents in the photoresist composition in some embodiments. The photoresist layer 15 is baked at a temperature and time sufficient to dry the photoresist layer 15. In some embodiments, the photoresist layer is heated to a temperature of about 40° C. and 120° C. for about 10 seconds to about 10 minutes.

After the first baking operation S120, the photoresist layer 15 is selectively exposed to actinic radiation 45 (see FIGS. 3A and 3B) in operation S130. In some embodiments, the photoresist layer 15 is selectively exposed to ultraviolet radiation. In some embodiments, the ultraviolet radiation is deep ultraviolet radiation. In some embodiments, the ultraviolet radiation is extreme ultraviolet (EUV) radiation. In some embodiments, the radiation is an electron beam.

Figure 3B:
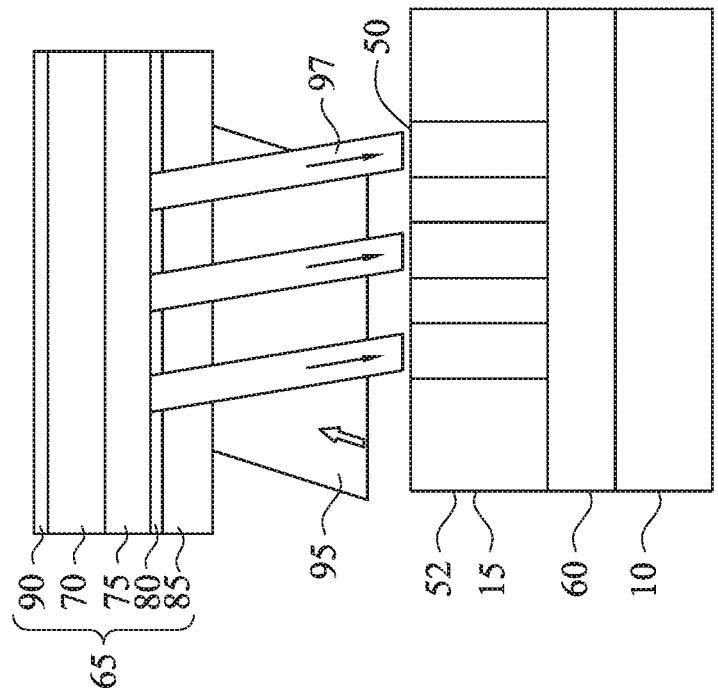
FIGS. 3A and 3B show a process stage of a sequential operation according to an embodiment of the disclosure.
Figure 3A:
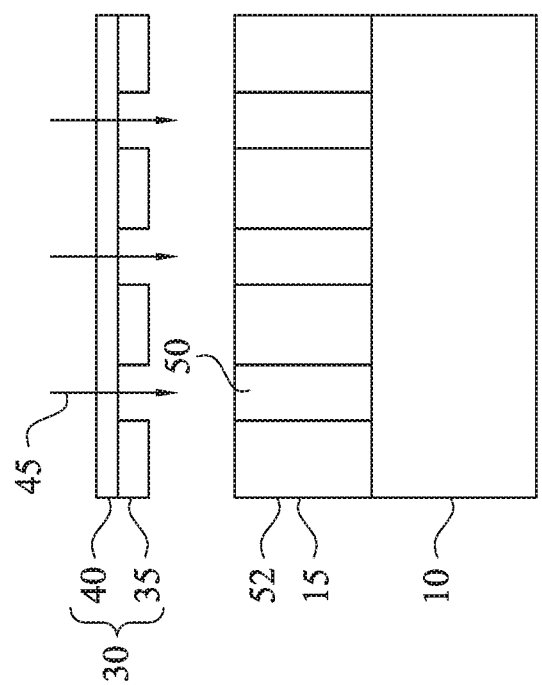

As shown in FIG. 3A, the exposure radiation 45 passes through a photomask 30 before irradiating the photoresist layer 15 in some embodiments. In some embodiments, the photomask has a pattern to be replicated in the photoresist layer 15. The pattern is formed by an opaque pattern 35 on photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

In some embodiments, the selective exposure of the photoresist layer 15 to form exposed regions 50 and unexposed regions 52 is performed using extreme ultraviolet lithography. In an extreme ultraviolet lithography operation a reflective photomask 65 is used to form the patterned exposure light, as shown in FIG. 3B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist-coated substrate 10, while the portion of the extreme ultraviolet radiation incident upon the absorber 85 is absorbed by the photomask. In some embodiments, additional optics, including mirrors are between the reflective photomask 65 and the photoresist-coated substrate.

The region of the photoresist layer exposed to radiation 50 undergoes a chemical reaction thereby changing its solubility in a subsequently applied developer relative to the region of the photoresist layer not exposed to radiation 52. In some embodiments, the portion of the photoresist layer exposed to radiation 50 undergoes a crosslinking reaction.

Next the photoresist layer 15 undergoes a post-exposure bake in operation S140. In some embodiments, the photoresist layer 15 is heated to a temperature of about 50° C. and 160° C. for about 20 seconds to about 120 seconds. The post-exposure baking may be used in order to assist in the generating, dispersing, and reacting of the acid/base/free radical generated from the impingement of the radiation 45/97 upon the photoresist layer 15 during the exposure. Such assistance helps to create or enhance chemical reactions which generate chemical differences between the exposed region 50 and the unexposed region 52 within the photoresist layer. These chemical differences also cause differences in the solubility between the exposed region 50 and the unexposed region 52.

As shown in FIG. 4, an embodiment of a photoresist according to the disclosure is an organometallic photoresist including a metallic core and organic linking groups (or ligands). The addition of an enhancement additive to the organometallic photoresist allows a greater amount of water (H—OH) to get between the organometallic compounds, thereby facilitating separation of the organometallic compounds during development of the photoresist. In some embodiments, the source of the water is ambient humidity; the photoresist itself; or from a processing operation, such as development or rinsing. Thus, the enhancement additive increases the sensitivity of the photoresist and provides higher resolution of the photoresist. The enhancement additive includes —OH and/or —COOH groups that function to absorb water.

The metallic cores in the organometallic photoresist increase the EUV photon absorption of EUV photoresists. In some embodiments, the organometallic compound particles increase the etch selectivity of the photoresist compared to a photoresist without the organometallic compound particles. On the other hand, the organometallic particles may aggregate to form larger particles, which may affect the resolution of the exposed and developed photoresist pattern. It is desirable to separate the organometallic compound aggregates to improve the resolution of the developed photoresist.

Figure 5:
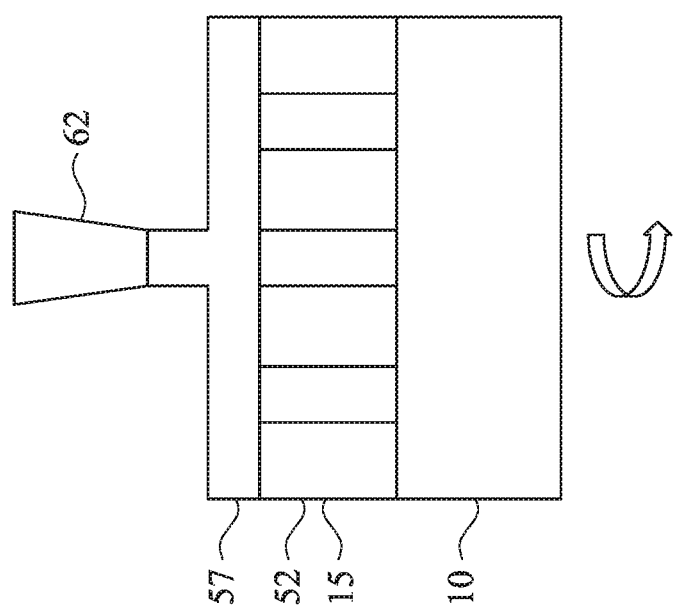
FIG. 5 shows a process stage of a sequential operation according to an embodiment of the disclosure.
Figure 6:
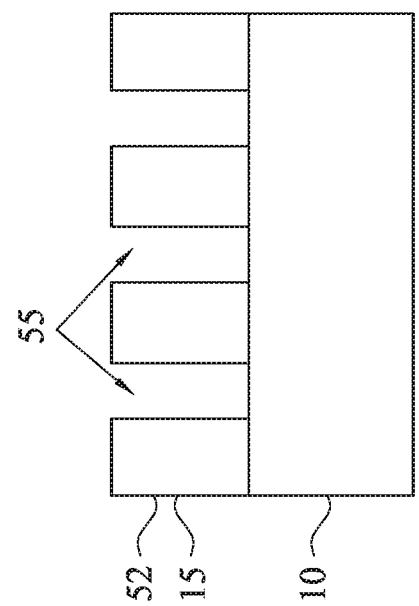
FIG. 6 shows a process stage of a sequential operation according to an embodiment of the disclosure.

The selectively exposed photoresist layer is subsequently developed by applying a developer to the selectively exposed photoresist layer in operation S150. As shown in FIG. 5, a developer 57 is supplied from a dispenser 62 to the photoresist layer 15. In some embodiments, the exposed portion of the photoresist layer 50 is removed by the developer 57 forming a pattern of openings 55 in the photoresist layer 15 to expose the substrate 20, as shown in FIG. 6.

Figure 7:
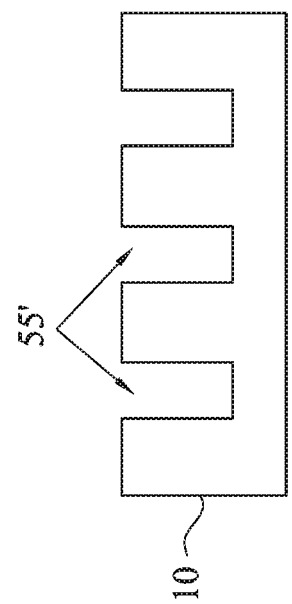
FIG. 7 shows a process stage of a sequential operation according to an embodiment of the disclosure.

In some embodiments, the pattern of openings 55 in the photoresist layer 15 is extended into the layer to be patterned or substrate 10 to create a pattern of openings 55' in the substrate 10, thereby transferring the pattern in the photoresist layer 15 into the substrate 10, as shown in FIG. 7. The pattern is extended into the substrate by etching, using one or more suitable etchants. The unexposed photoresist layer 15 is at least partially removed during the etching operation in some embodiments. In other embodiments, the unexposed photoresist layer 15 is removed after etching the substrate 10 by using a suitable photoresist stripper solvent or by a photoresist ashing operation.

In some embodiments, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes at least one metal, metal alloy, and metal/nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric having at least silicon, metal oxide, and metal nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

The photoresist layer 15 is a photosensitive layer that is patterned by exposure to actinic radiation. Typically, the chemical properties of the photoresist regions struck by incident radiation change in a manner that depends on the type of photoresist used. Photoresist layers 15 are positive tone resists or negative tone resists. The positive tone resist refers to a photoresist material that when exposed to radiation (such as UV light) becomes soluble in a developer, while the region of the photoresist that is non-exposed (or exposed less) is insoluble in the developer. The negative-tone resist, on the other hand, refers to a photoresist material that when exposed to radiation becomes insoluble in the developer, while the region of the photoresist that is non-exposed (or exposed less) is soluble in the developer. The region of the negative tone resist that becomes insoluble upon exposure to radiation may become insoluble due to a cross-linking reaction caused by the exposure to radiation.

Whether a resist is a positive tone or negative tone may depend on the type of developer used to develop the resist. For example, some positive photoresists provide a positive pattern, (i.e.—the exposed regions are removed by the developer), when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent. Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development. In some embodiments of the present disclosure, a negative tone photoresist is exposed to actinic radiation. The exposed portions of the negative tone photoresist undergo crosslinking as a result of the exposure to actinic radiation, and during development the exposed, crosslinked portions of the photoresist are removed by the developer leaving the unexposed regions of the photoresist remaining on the substrate.

In an embodiment, the photoresist layer 15 is a negative tone photoresist that undergoes a cross-linking reaction upon exposure to the radiation.

Photoresist compositions according to the present disclosure include a polymer resin, a photoactive compound, an organometallic compound, an enhancement additive, and a first solvent.

In some embodiments, the enhancement additive is an ionic surfactant, a non-ionic surfactant, or a second solvent having a boiling point of greater than 150° C. Because the second solvent has a boiling point of greater than 150° C., the second solvent remains in the photoresist composition after baking operations below 150° C., which improves the uniformity of the resist film in some embodiments. In some embodiments, the ionic surfactant is one or more selected from:

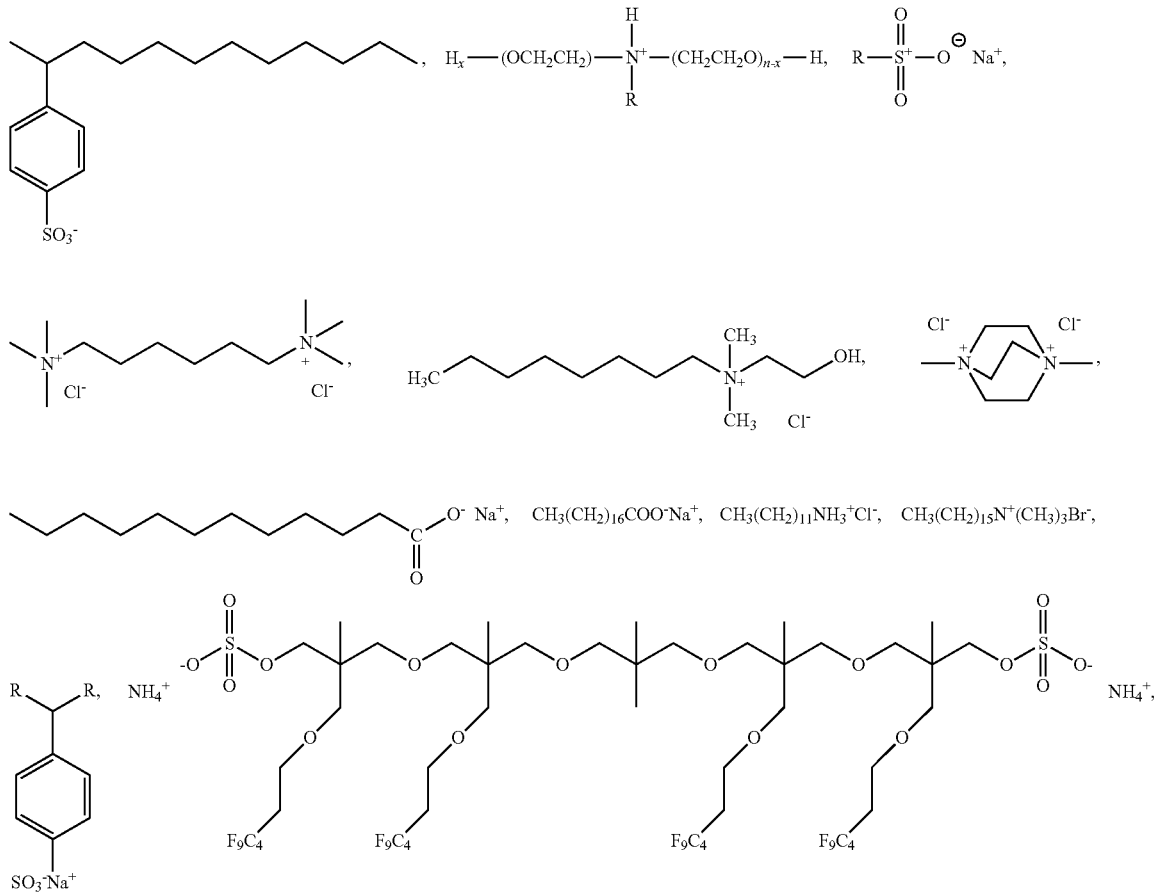

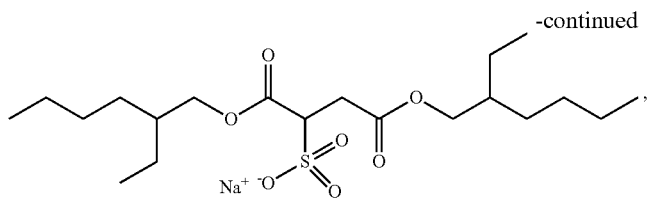

wherein R is a substituted or unsubstituted C1-C12 alkyl, C1-C12 aryl, C1-C12 aralkyl, or the like.

In some embodiments, the non-ionic surfactant is one or more selected from:

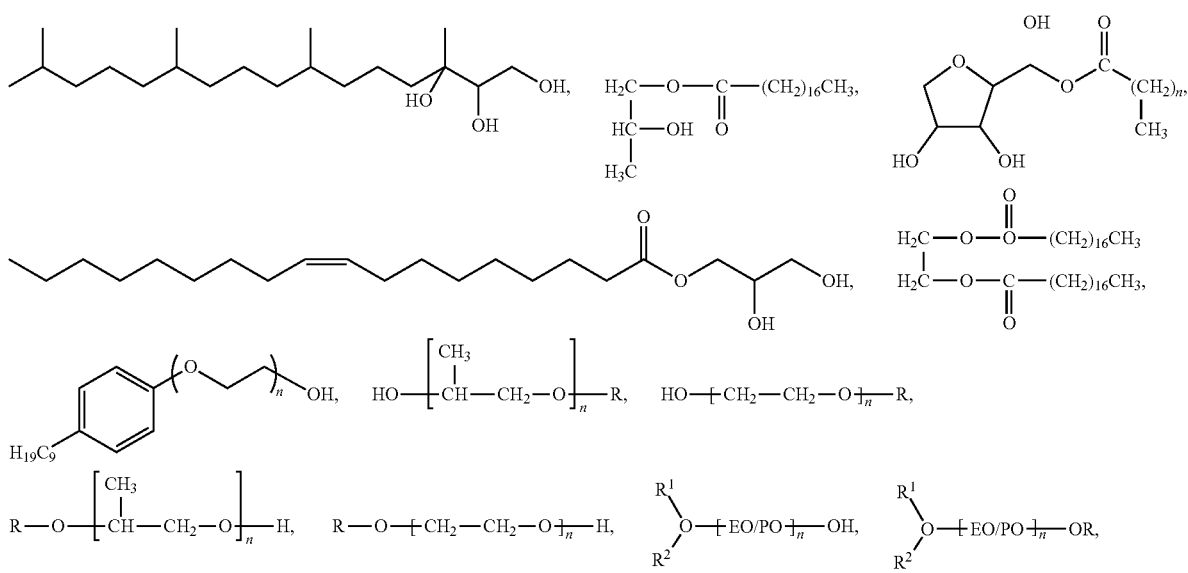

wherein n is the number of repeat units in the oligomer or polymer; R, $R^1$, and $R^2$ are the same or different and are a substituted or unsubstituted C1-C25 alkyl, C1-C25 aryl, C1-C25 aralkyl, or the like; and EO/PO is ethylene oxide, propylene oxide, or a copolymer of ethylene oxide and propylene oxide. In some embodiments, the second solvent having a boiling point of greater than 150° C. is one or more selected from: cyclohexyl acetate, dipropylene glycol dimethyl ether, propylene glycol diacetate, dipropylene glycol methyl propylene ether, di(propylene glycol) methyl ether acetate, 1,4-diacetoxybutane, 1,3-butanediol diacetate, 1,6-diacetoxyhexane, tripropylene glycol methyl ether, 1,3-propanediol, propylene glycol, 1,3-butanediol, propylene glycol butyl ether, dipropylene glycol monomethyl ether, diethylene glycol monoethyl ether, di(propylene glycol) butyl ether, tri(propylene glycol) butyl ether,

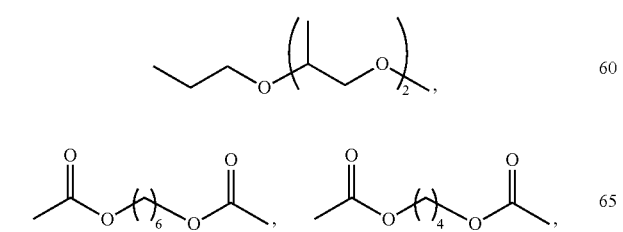

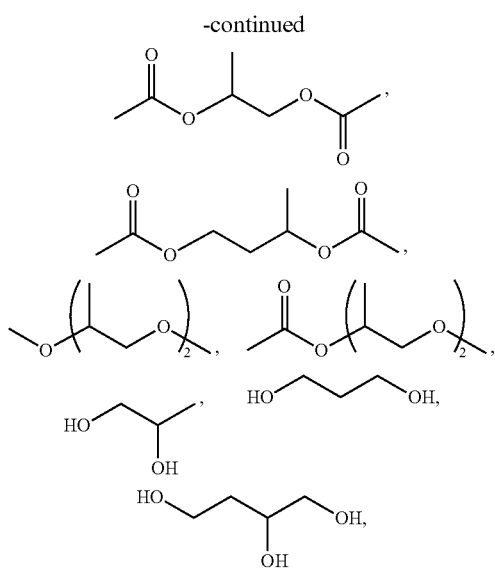

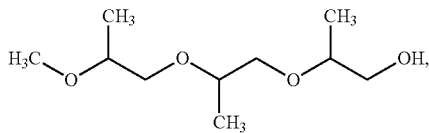

-continued

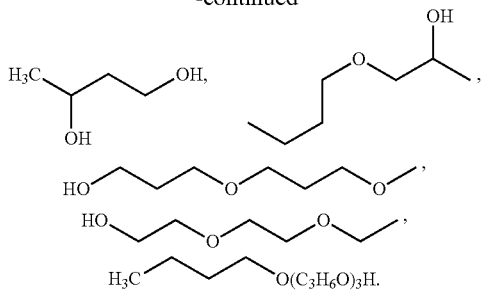

In some embodiments, the concentration of the second solvent having a boiling point of greater than 150° C. is about 3 wt. % to about 100 wt. % of the total weight of the second solvent and the first solvent. Second solvent concentrations in this range improve the uniformity of resist film in some embodiments, as the second solvent remains in the photoresist composition after baking operations below 150° C.

In some embodiments, the concentration of the ionic surfactant or non-ionic surfactant is 10 ppm to 1,000 ppm based on the total weight of the ionic surfactant or non-ionic surfactant and the first solvent. Surfactant concentrations in this concentration range inhibits aggregation of the photoresist, thereby reducing the exposure energy required to satisfactorily expose the photoresist and reducing wafer defects.

In some embodiments, the organometallic compound includes a metal oxide nanoparticle and one or more organic ligands. In some embodiments, organometallic compound includes one or more metal oxides nanoparticles selected from the group consisting of titanium dioxide, zinc oxide, zirconium dioxide, nickel oxide, cobalt oxide, manganese oxide, copper oxides, iron oxides, strontium titanate, tungsten oxides, vanadium oxides, chromium oxides, tin oxides, hafnium oxide, indium oxide, cadmium oxide, molybdenum oxide, tantalum oxides, niobium oxide, aluminum oxide, and combinations thereof. As used herein, nanoparticles are particles having an average particle size between about 1 nm and about 20 nm. In some embodiments, the metal oxide nanoparticles have an average particle size between about 2 nm and about 5 nm. In some embodiments, the amount of metal oxide nanoparticles in the photoresist composition ranges from about 1 wt. % to about 15 wt. % based on the weight of the first solvent. In some embodiments, the amount of nanoparticles in the photoresist composition ranges from about 5 wt. % to about 10 wt. % based on the weight of the first solvent. Below about 1 wt. % metal oxide nanoparticles the photoresist coating is too thin. Concentrations of the metal oxide nanoparticles greater than about 15 wt. % will provide a photoresist composition that is too viscous and that will be difficult to provide a photoresist coating of uniform thickness on the substrate.

In some embodiments, the metal oxide nanoparticles are complexed with a ligand. In some embodiments, the ligand is a carboxylic acid or sulfonic acid ligand. For example, in some embodiments, zirconium oxide or hafnium oxide nanoparticles are complexed with methacrylic acid forming hafnium methacrylic acid (HfMAA) or zirconium methacrylic acid (ZrMAA). In some embodiments, the metal oxide nanoparticles are complexed with ligands including aliphatic or aromatic groups. The aliphatic or aromatic groups may be unbranched or branched with cyclic or noncyclic saturated pendant groups containing 1-9 carbons, including alkyl groups, alkenyl groups, and phenyl groups. The branched groups may be further substituted with oxygen or halogen.

In some embodiments, the metal oxide/ligand complexes are formed of a cluster including metallic core having a metal with high EUV absorption, such as Cs, Ba, La, Ce, In, Sn, Ag, or Sb combined with oxygen and/or nitrogen to form 1 to 12 metal core-clusters. The metallic core-clusters are complexed with ligands including aliphatic or aromatic groups. The aliphatic or aromatic groups may be unbranched or branched with cyclic or noncyclic saturated pendant groups containing 1-9 carbons, including alkyl groups, alkenyl groups, and phenyl groups. The branched groups may be further substituted with oxygen or halogen in some embodiments.

In some embodiments, the photoresist composition includes about 0.1 wt. % to about 20 wt. % of the ligand based on the total weight of the photoresist composition. In some embodiments, the photoresist includes about 1 wt. % to about 10 wt. % of the ligand based on the total weight of the photoresist composition. In some embodiments, the ligand concentration is about 10 wt. % to about 40 wt. % based on the weight of the metal oxide nanoparticles and the ligand. Below about 10 wt. % ligand the organometallic photoresist does not function well. Above about 40 wt. % ligand it is hard to form the photoresist layer. In some embodiments, the ligand is HfMAA or ZrMAA dissolved at about a 5 wt. % to about 10 wt. % weight range in a coating solvent, such as propylene glycol methyl ether acetate (PGMEA).

In some embodiments, the polymer resins and the photoactive compounds (PACs), along with any desired additives or other agents, are added to the solvent before application of the photoresist to the substrate. Once added, the mixture is then mixed in order to achieve a homogenous composition throughout the photoresist to ensure that there are no defects caused by uneven mixing or nonhomogeneous composition of the photoresist. Once mixed together, the photoresist may either be stored prior to its usage or used immediately.

In some embodiments, the first solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

In some embodiments, the photoresist composition further includes water at a concentration of 10 ppm to 250 ppm based on the total composition of the water, enhancement additive, and first solvent.

In some embodiments, the photoresist composition includes a polymer resin along with one or more photoactive compounds (PACs). In some embodiments, the polymer resin includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclododecane, or the like.

The group which will decompose, otherwise known as a leaving group or, in some embodiments in which the PAC is a photoacid generator, an acid labile group, is attached to the hydrocarbon structure so that, it will react with the acids/bases/free radicals generated by the PACs during exposure. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl) methylene group, an (alkylsulfonyl)(alkyl-carbonyl)imido group, a bis(alkylcarbonyl)methylene group, a bis(alkylcarbonyl)imido group, a bis(alkylsylfonyl)methylene group, a bis(alkylsulfonyl) imido group, a tris(alkylcarbonyl methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

In some embodiments, the polymer resin also includes other groups attached to the hydrocarbon structure that help to improve a variety of properties of the polymerizable resin. For example, inclusion of a lactone group to the hydrocarbon structure assists to reduce the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, the polymer resin includes groups that can assist in increasing the adhesiveness of the photoresist layer 15 to underlying structures (e.g., substrate 10). Polar groups may be used to help increase the adhesiveness. Suitable polar groups include hydroxyl groups, cyano groups, or the like, although any suitable polar group may, alternatively, be used.

Optionally, the polymer resin includes one or more alicyclic hydrocarbon structures that do not also contain a group which will decompose in some embodiments. In some embodiments, the hydrocarbon structure that does not contain a group which will decompose includes structures such as 1-adamantyl(meth)acrylate, tricyclodecanyl (meth)acrylate, cyclohexyl (methacrylate), combinations of these, or the like.

Additionally, some embodiments of the photoresist include one or more photoactive compounds (PACs). The PACs are photoactive components, such as photoacid generators, photobase generators, free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyaminesulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

In some embodiments in which the PACs are photobase generators, the PACs include quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl)cyclic amines, combinations of these, or the like.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments.

In some embodiments, a cross-linking agent is added to the photoresist. The cross-linking agent reacts with one group from one of the hydrocarbon structures in the polymer resin and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

In some embodiments the cross-linking agent has the following structure:

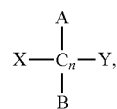

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C.

Specific examples of materials that may be used as the cross-linking agent include the following:

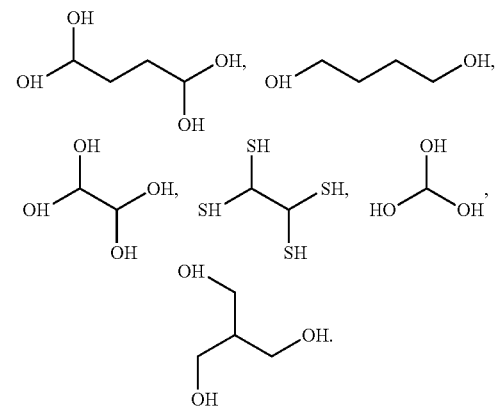

Alternatively, instead of or in addition to the cross-linking agent being added to the photoresist composition, a coupling reagent is added in some embodiments, in which the coupling reagent is added in addition to the cross-linking agent. The coupling reagent assists the cross-linking reaction by reacting with the groups on the hydrocarbon structure in the polymer resin before the cross-linking reagent, allowing for a reduction in the reaction energy of the cross-linking reaction and an increase in the rate of reaction. The bonded coupling reagent then reacts with the cross-linking agent, thereby coupling the cross-linking agent to the polymer resin.

Alternatively, in some embodiments in which the coupling reagent is added to the photoresist without the cross-linking agent, the coupling reagent is used to couple one group from one of the hydrocarbon structures in the polymer resin to a second group from a separate one of the hydrocarbon structures in order to cross-link and bond the two polymers together. However, in such an embodiment the coupling reagent, unlike the cross-linking agent, does not remain as part of the polymer, and only assists in bonding one hydrocarbon structure directly to another hydrocarbon structure.

In some embodiments, the coupling reagent has the following structure:

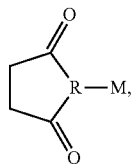

where R is a carbon atom, a nitrogen atom, a sulfur atom, or an oxygen atom; M includes a chlorine atom, a bromine atom, an iodine atom, —$NO_2$; —$SO_3$—; —H—; —CN; —NCO, —OCN; —$CO_2$—; —OH; —OR*, —OC(O)CR*; —SR, —$SO_2N(R*)_2$; —$SO_2R*$; SOR; —OC(O)R*; —C(O)OR*; —C(O)R*; —$Si(OR*)_3$; —$Si(R*)_3$; epoxy groups, or the like; and R* is a substituted or unsubstituted C1-C12 alkyl, C1-C12 aryl, C1-C12 aralkyl, or the like. Specific examples of materials used as the coupling reagent in some embodiments include the following:

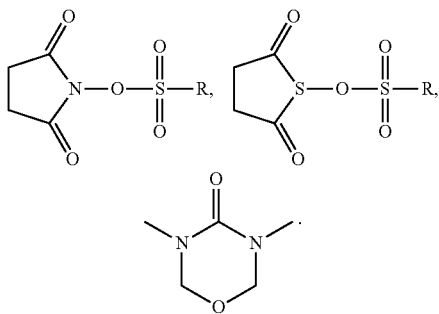

The individual components of the photoresist are placed into a solvent in order to aid in the mixing and dispensing of the photoresist. To aid in the mixing and dispensing of the photoresist, the solvent is chosen at least in part based upon the materials chosen for the polymer resin as well as the PACs. In some embodiments, the solvent is chosen such that the polymer resin and the PACs are evenly dissolved into the solvent and dispensed upon the layer to be patterned.

Another additive added to some embodiments of the photoresist is a quencher, which inhibits diffusion of the generated acids/bases/free radicals within the photoresist. The quencher improves the resist pattern configuration as well as the stability of the photoresist over time. In an embodiment, the quencher is an amine, such as a second lower aliphatic amine, a tertiary lower aliphatic amine, or the like. Specific examples of amines include trimethylamine, diethylamine, triethylamine, di-n-propylamine, tri-n-propylamine, tripentylamine, diethanolamine, and triethanolamine, alkanolamine, combinations thereof, or the like.

In some embodiments, an organic acid is used as the quencher. Specific embodiments of organic acids include malonic acid, citric acid, malic acid, succinic acid, benzoic acid, salicylic acid; phosphorous oxo acid and its derivatives, such as phosphoric acid and derivatives thereof such as its esters, phosphoric acid di-n-butyl ester and phosphoric acid diphenyl ester; phosphonic acid and derivatives thereof such as its ester, such as phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phenylphosphinic acid.

Another additive added to some embodiments of the photoresist is a stabilizer, which assists in preventing undesired diffusion of the acids generated during exposure of the photoresist. In some embodiments, the stabilizer includes nitrogenous compounds, including aliphatic primary, secondary, and tertiary amines; cyclic amines, including piperidines, pyrrolidines, morpholines; aromatic heterocycles, including pyridines, pyrimidines, purines; imines, including diazabicycloundecene, guanidines, imides, amides, or the like. Alternatively, ammonium salts are also be used for the stabilizer in some embodiments, including ammonium, primary, secondary, tertiary, and quaternary alkyl- and arylammonium salts of alkoxides, including hydroxide, phenolates, carboxylates, aryl and alkyl sulfonates, sulfonamides, or the like. Other cationic nitrogenous compounds, including pyridinium salts and salts of other heterocyclic nitrogenous compounds with anions, such as alkoxides, including hydroxide, phenolates, carboxylates, aryl and alkyl sulfonates, sulfonamides, or the like, are used in some embodiments.

Another additive in some embodiments of the photoresist is a dissolution inhibitor to help control dissolution of the photoresist during development. In an embodiment bile-salt esters may be utilized as the dissolution inhibitor. Specific examples of dissolution inhibitors in some embodiments include cholic acid, deoxycholic acid, lithocholic acid, t-butyl deoxycholate, t-butyl lithocholate, and t-butyl-3-acetyl lithocholate.

Another additive in some embodiments of the photoresist is a plasticizer. Plasticizers may be used to reduce delamination and cracking between the photoresist and underlying layers (e.g., the layer to be patterned). Plasticizers include monomeric, oligomeric, and polymeric plasticizers, such as oligo- and polyethyleneglycol ethers, cycloaliphatic esters, and non-acid reactive steroidaly-derived materials. Specific examples of materials used for the plasticizer in some embodiments include dioctyl phthalate, didodecyl phthalate, triethylene glycol dicaprylate, dimethyl glycol phthalate, tricresyl phosphate, dioctyl adipate, dibutyl sebacate, triacetyl glycerine, or the like.

A coloring agent is another additive included in some embodiments of the photoresist. The coloring agent enables observers to examine the photoresist and find any defects that may need to be remedied prior to further processing. In some embodiments, the coloring agent is a triarylmethane dye or a fine particle organic pigment. Specific examples of materials in some embodiments include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045), rhodamine 6G (C. I. 45160), benzophenone compounds, such as 2,4-dihydroxybenzophenone and 2,2',4,4'-tetrahydroxybenzophenone; salicylic acid compounds, such as phenyl salicylate and 4-t-butylphenyl salicylate; phenylacrylate compounds, such as ethyl-2-cyano-3,3-diphenylacrylate, and 2'-ethylhexyl-2-cyano-3,3-diphenylacrylate; benzotriazole compounds, such as 2-(2-hydroxy-5-methylphenyl)-2H-benzotriazole, and 2-(3-t-butyl-2-hydroxy-5-methylphenyl)-5-chloro-2H-benzotriazole; coumarin compounds, such as 4-methyl-7-diethylamino-1-benzopyran-2-one; thioxanthone compounds, such as diethylthioxanthone; stilbene compounds, naphthalic acid compounds, azo dyes, phthalocyanine blue, phthalocyanine green, iodine green, Victoria blue, crystal violet, titanium oxide, naphthalene black, Photopia methyl violet, bromphenol blue and bromcresol green; laser dyes, such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives are added to some embodiments of the photoresist to promote adhesion between the photoresist and an underlying layer upon which the photoresist has been applied (e.g., the layer to be patterned). In some embodiments, the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, an organophosphorus compound, 8-oxyquinoline, 4-hydroxypteridine and derivatives, 1,10-phenanthroline and derivatives, 2,2'-bi-pyridine and derivatives, benzotriazoles, organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations thereof, or the like.

Surface leveling agents are added to some embodiments of the photoresist to assist a top surface of the photoresist to be level, so that impinging light will not be adversely modified by an unlevel surface. In some embodiments, surface leveling agents include fluoroaliphatic esters, hydroxyl terminated fluorinated polyethers, fluorinated ethylene glycol polymers, silicones, acrylic polymer leveling agents, combinations thereof, or the like.

In some embodiments, the polymer resin and the PACs, along with any desired additives or other agents, are added to the solvent for application. Once added, the mixture is then mixed in order to achieve a homogenous composition throughout the photoresist to ensure that there are no defects caused by uneven mixing or nonhomogenous composition of the photoresist. Once mixed together, the photoresist may either be stored prior to its usage or used immediately.

Once ready, the photoresist is applied onto the layer to be patterned, as shown in FIG. 2, such as the substrate 10 to form a photoresist layer 15. In some embodiments, the photoresist is applied using a process such as a spin-on coating process, a dip coating method, an air-knife coating method, a curtain coating method, a wire-bar coating method, a gravure coating method, a lamination method, an extrusion coating method, combinations of these, or the like. In some embodiments, the photoresist layer 15 thickness ranges from about 10 nm to about 300 nm.

After the photoresist layer 15 has been applied to the substrate 10, a pre-bake S120 of the photoresist layer is performed in some embodiments to dry the photoresist prior to radiation exposure (see FIG. 1). The drying of the photoresist layer 15 removes the volatile solvent components while leaving behind the polymer resin, the PACs, the cross-linking agent, and the other chosen additives. In some embodiments, the pre-baking is performed at a temperature suitable to evaporate the solvent, such as between about 40° C. and 120° C., although the precise temperature depends upon the materials chosen for the photoresist. The pre-baking is performed for a time sufficient to cure and dry the photoresist layer, such as between about 10 seconds to about 10 minutes.

FIGS. 3A and 3B illustrate a selective exposure of the photoresist layer to form an exposed region 50 and an unexposed region 15. In some embodiments, the exposure to radiation is carried out by placing the photoresist coated substrate in a photolithography tool. The photolithography tool includes a photomask 30, optics, an exposure radiation source to provide the radiation 45 for exposure, and a movable stage for supporting and moving the substrate under the exposure radiation.

In some embodiments, the radiation source (not shown) supplies radiation 45, such as ultraviolet light, to the photoresist layer 15 in order to induce a reaction of the PACs, which in turn reacts with the polymer resin to chemically alter those regions of the photoresist layer to which the radiation 45 impinges. In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

In some embodiments, optics (not shown) are used in the photolithography tool to expand, reflect, or otherwise control the radiation before or after the radiation 45 is patterned by the photomask 30. In some embodiments, the optics include one or more lenses, mirrors, filters, and combinations thereof to control the radiation 45 along its path.

In an embodiment, the patterned radiation 45 is extreme ultraviolet light having a 13.5 nm wavelength, the PAC is a photoacid generator, the group to be decomposed is a carboxylic acid group on the hydrocarbon structure, and a cross linking agent is used. In some embodiments, the photomask is a reflective photomask and the radiation from the radiation source is reflected off the photomask and is directed towards the photoresist. The patterned radiation 45 impinges upon the photoresist, and the photoacid generator in the photoresist absorbs the impinging patterned radiation 45. This absorption initiates the photoacid generator to generate a proton (e.g., a $H^+$ atom) within the photoresist layer 15. When the proton impacts the carboxylic acid group on the hydrocarbon structure, the proton reacts with the carboxylic acid group, chemically altering the carboxylic acid group and altering the properties of the polymer resin in general. The carboxylic acid group then reacts with the cross-linking agent to cross-link with other polymer resins within the exposed region of the photoresist layer 15.

In some embodiments, the exposure of the photoresist layer 15 uses an immersion lithography technique. In such a technique, an immersion medium (not shown) is placed between the final optics and the photoresist layer, and the exposure radiation 45 passes through the immersion medium.

After the photoresist layer 15 has been exposed to the exposure radiation 45, a post-exposure baking is performed in some embodiments to assist in the generating, dispersing, and reacting of the acid/base/free radical generated from the impingement of the radiation 45 upon the PACs during the exposure. Such thermal assistance helps to create or enhance chemical reactions which generate chemical differences between the exposed region 50 and the unexposed region 52 within the photoresist layer 15. These chemical differences also cause differences in the solubility between the exposed region 50 and the unexposed region 52. In some embodiments, the post-exposure baking occurs at temperatures ranging from about 50° C. to about 160° C. for a period of between about 20 seconds and about 120 seconds.

The inclusion of the cross-linking agent into the chemical reactions helps the components of the polymer resin (e.g., the individual polymers) react and bond with each other, increasing the molecular weight of the bonded polymer in some embodiments. In particular, an initial polymer has a side chain with a carboxylic acid protected by one of the groups to be removed/acid labile groups. The groups to be removed are removed in a de-protecting reaction, which is initiated by a proton $H^+$ generated by, e.g., the photoacid generator during either the exposure process or during the post-exposure baking process. The $H^+$ first removes the groups to be removed/acid labile groups and another hydrogen atom may replace the removed structure to form a de-protected polymer. Once de-protected, a cross-linking reaction occurs between two separate de-protected polymers that have undergone the de-protecting reaction and the cross-linking agent in a cross-linking reaction. In particular, hydrogen atoms within the carboxylic groups formed by the de-protecting reaction are removed and the oxygen atoms react with and bond with the cross-linking agent. This bonding of the cross-linking agent to two polymers bonds the two polymers not only to the cross-linking agent but also bonds the two polymers to each other through the cross-linking agent, thereby forming a cross-linked polymer.

By increasing the molecular weight of the polymers through the cross-linking reaction, the new cross-linked polymer becomes less soluble in conventional organic solvent negative resist developers.

In some embodiments, the developer 57 is applied to the photoresist layer 15 using a spin-on process. In the spin-on process, the developer 57 is applied to the photoresist layer 15 from above the photoresist layer 15 while the photoresist-coated substrate is rotated, as shown in FIG. 5. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

During the development process, the developer 57 dissolves the radiation-exposed regions 50 of the resist, exposing the surface of the substrate 10, as shown in FIG. 6, and leaving behind well-defined unexposed photoresist regions 52, having improved definition than provided by conventional photoresist photolithography.

In some embodiments, the photoresist developer 57 includes a solvent, and an acid or a base. In some embodiments, the concentration of the solvent is from about 60 wt. % to about 99 wt. % based on the total weight of the photoresist developer. The acid or base concentration is from about 0.001 wt. % to about 20 wt. % based on the total weight of the photoresist developer. In certain embodiments, the acid or base concentration in the developer is from about 0.01 wt. % to about 15 wt. % based on the total weight of the photoresist developer.

In some embodiments, the developer 57 includes the enhancement additive and a solvent having a boiling point greater than 150° C. In some embodiments, the enhancement additive and the solvent are the same as the additives and solvents disclosed herein for the photoresist composition. The additive range is about 10 ppm to about 1,000 ppm, and the solvent concentration range is about 1 wt. % to about 20 wt. % based on the total weight of the developer composition. In some embodiments, the enhancement additive is an ionic surfactant, a non-ionic surfactant, or a second solvent having a boiling point of greater than 150° C. The disclosed concentration range of the additive reduces the surface tension of developer to enhance the solubility of resist in some embodiments.

In some embodiments, the ionic surfactant in the developer 57 is one or more selected from:

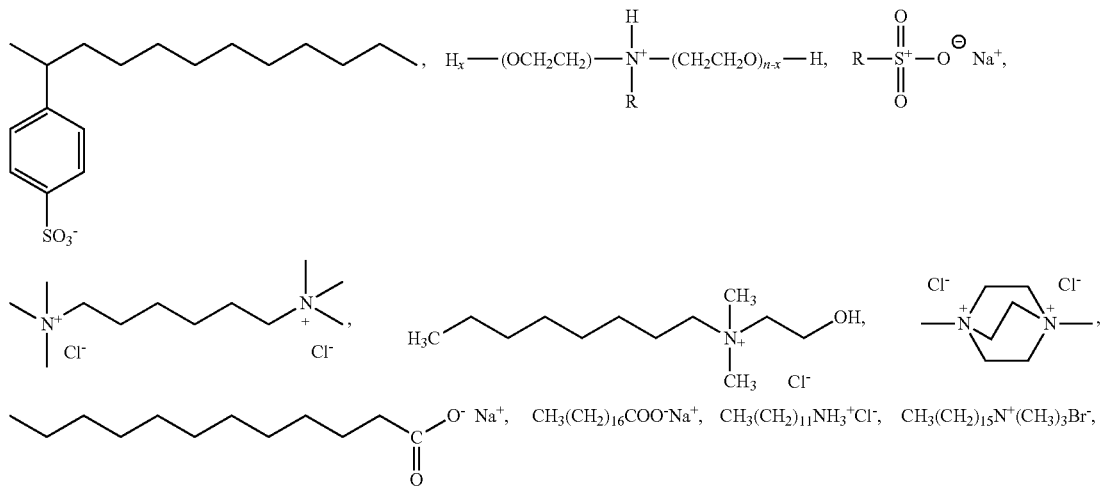

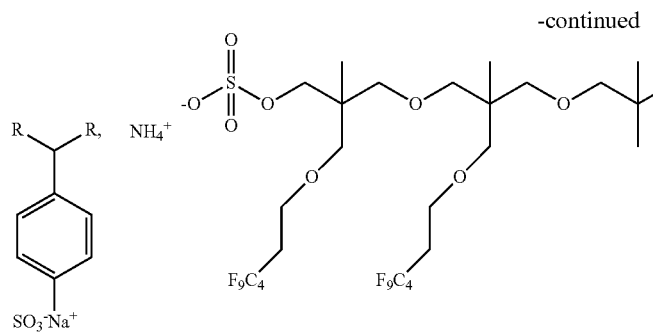

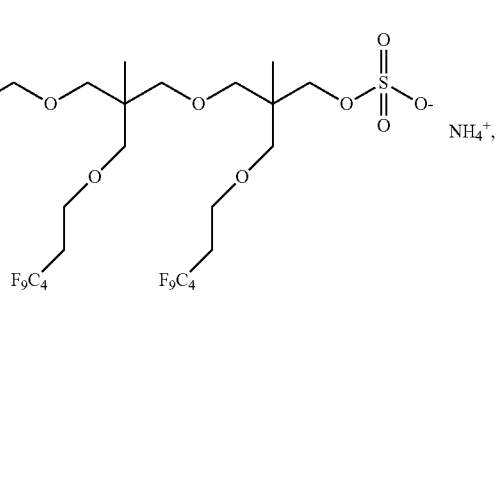

wherein R is a substituted or unsubstituted C1-C12 alkyl, C1-C12 aryl, C1-C12 aralkyl, or the like.

In some embodiments, the non-ionic surfactant in the developer 57 is one or more selected from:

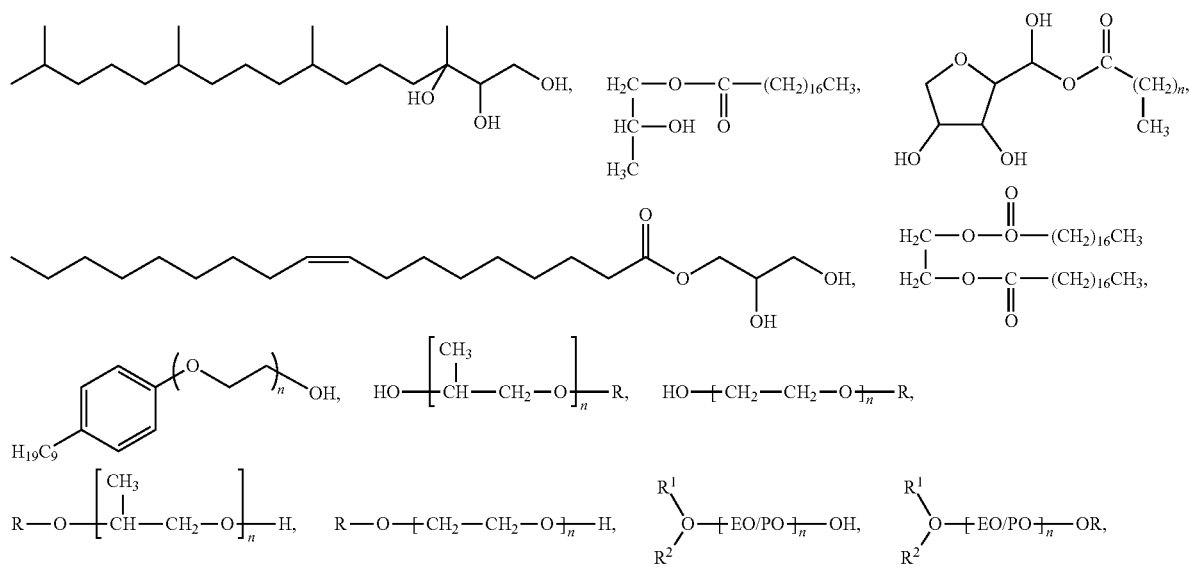

wherein n is the number of repeat units in the oligomer or polymer; R, $R^1$, and $R^2$ are the same or different and are a substituted or unsubstituted C1-C25 alkyl, C1-C25 aryl, C1-C25 aralkyl, or the like; and EO/PO is ethylene oxide, propylene oxide, or a copolymer of ethylene oxide and propylene oxide.

In some embodiments, the second solvent having a boiling point of greater than 150° C. in the developer 57 is one or more selected from: cyclohexyl acetate, dipropylene glycol dimethyl ether, propylene glycol diacetate, dipropylene glycol methyl propylene ether, di(propylene glycol) methyl ether acetate, 1,4-diacetoxybutane, 1,3-butanediol diacetate, 1,6-diacetoxyhexane, tripropylene glycol methyl ether, 1,3-propanediol, propylene glycol, 1,3-butanediol, propylene glycol butyl ether, dipropylene glycol monomethyl ether, diethylene glycol monoethyl ether, di(propylene glycol) butyl ether, tri(propylene glycol) butyl ether, -continued

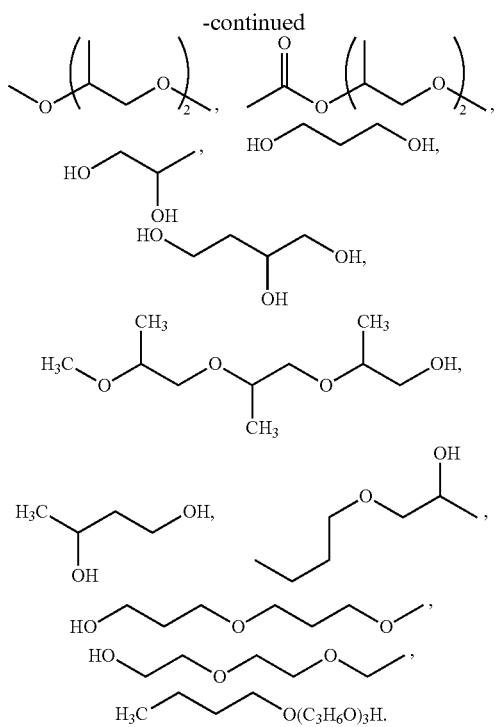

In some embodiments, the concentration of the second solvent having a boiling point of greater than 150° C. is 0.1 wt. % to 30 wt. % of the total weight of the second solvent and the first solvent.

In some embodiments, the concentration of the ionic surfactant or non-ionic surfactant is 10 ppm to 1,000 ppm based on the total weight of the developer composition.

After the developing operation S150, remaining developer is removed from the patterned photoresist covered substrate. The remaining developer is removed using a spin-dry process in some embodiments, although any suitable removal technique may be used. After the photoresist layer 15 is developed, and the remaining developer is removed, additional processing is performed while the patterned photoresist layer 52 is in place. For example, an etching operation, using dry or wet etching, is performed in some embodiments, to transfer the pattern of the photoresist layer 52 to the underlying substrate 10, forming recesses 55″ as shown in FIG. 7. The substrate 10 has a different etch resistance than the photoresist layer 15. In some embodiments, the etchant is more selective to the substrate 10 than the photoresist layer 15.

In some embodiments, the substrate 10 and the photoresist layer 15 contain at least one etching resistance molecule. In some embodiments, the etching resistant molecule includes a molecule having a low Onishi number structure, a double bond, a triple bond, silicon, silicon nitride, titanium, titanium nitride, aluminum, aluminum oxide, silicon oxynitride, combinations thereof, or the like.

Figure 8:
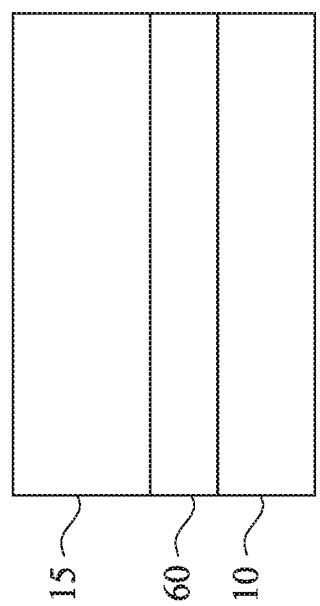
FIG. 8 shows a process stage of a sequential operation according to an embodiment of the disclosure.

In some embodiments, a layer to be patterned 60 is disposed over the substrate prior to forming the photoresist layer, as shown in FIG. 8. In some embodiments, the layer to be patterned 60 is a metallization layer or a dielectric layer, such as a passivation layer, disposed over a metallization layer. In embodiments where the layer to be patterned 60 is a metallization layer, the layer to be patterned 60 is formed of a conductive material using metallization processes, and metal deposition techniques, including chemical vapor deposition, atomic layer deposition, and physical vapor deposition (sputtering). Likewise, if the layer to be patterned 60 is a dielectric layer, the layer to be patterned 60 is formed by dielectric layer formation techniques, including thermal oxidation, chemical vapor deposition, atomic layer deposition, and physical vapor deposition.

The photoresist layer 50 is subsequently selectively exposed to actinic radiation 45 to form exposed regions 50 and unexposed regions 52 in the photoresist layer, as shown in FIGS. 9A and 9B, and described herein in relation to FIGS. 3A and 3B.

Figure 10:
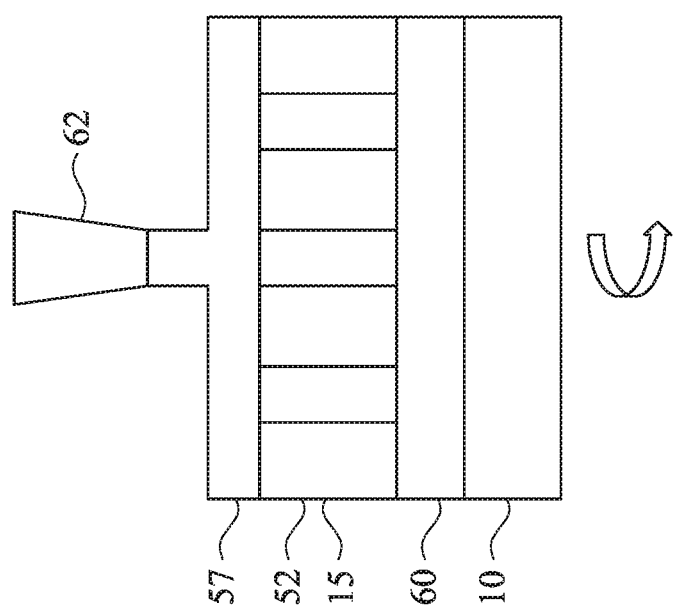
FIG. 10 shows a process stage of a sequential operation according to an embodiment of the disclosure.
Figure 11:
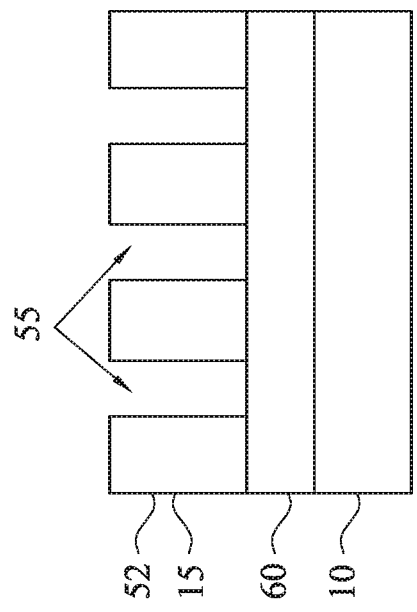
FIG. 11 shows a process stage of a sequential operation according to an embodiment of the disclosure.

As shown in FIG. 10, the exposed photoresist regions 50 are developed by dispensing developer 57 from a dispenser 62 to form a pattern of photoresist openings 55, as shown in FIG. 11. The development operation is similar to that explained with reference to FIGS. 5 and 6, herein.

Figure 12:
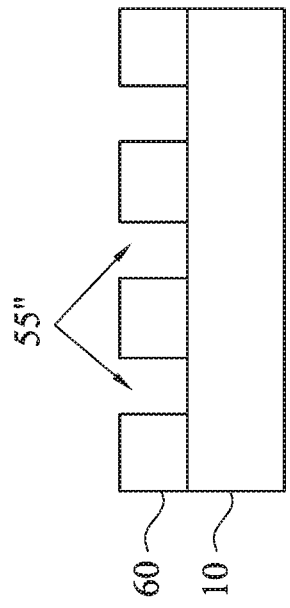
FIG. 12 shows a process stage of a sequential operation according to an embodiment of the disclosure.

Then as shown in FIG. 12, the pattern 55 in the photoresist layer 15 is transferred to the layer to be patterned 60 using an etching operation and the photoresist layer is removed, as explained with reference to FIG. 7 to form pattern 55″ in the layer to be patterned 60.

Figure 13B:
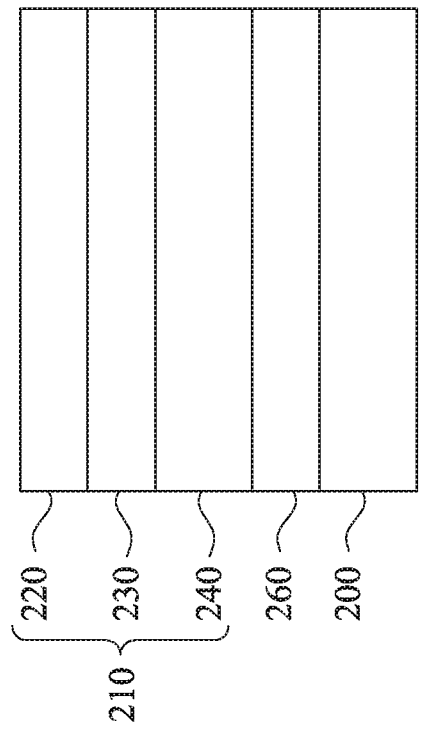
FIGS. 13A and 13B show process stages of sequential operations according to embodiments of the disclosure.
Figure 13A:
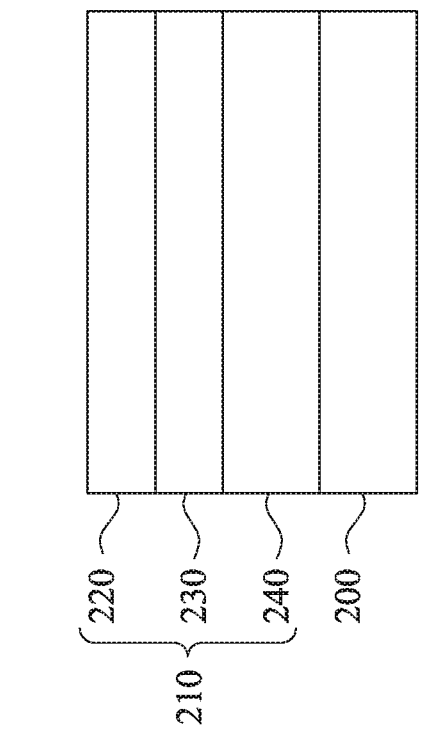
Figure 14B:
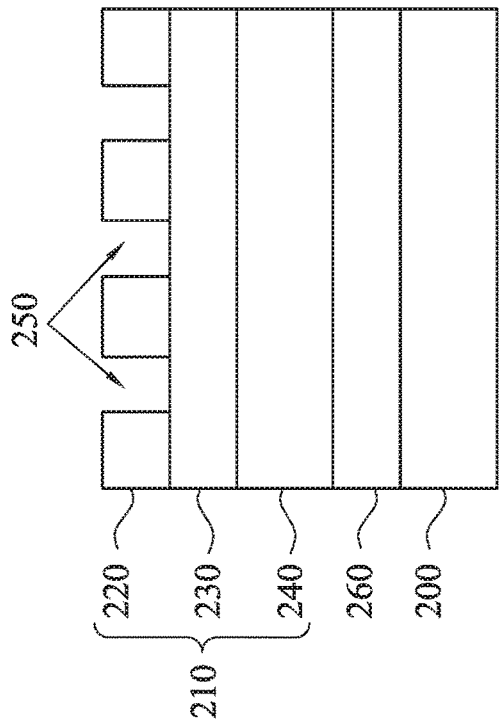
FIGS. 14A and 14B show process stages of sequential operations according to embodiments of the disclosure.
Figure 14A:
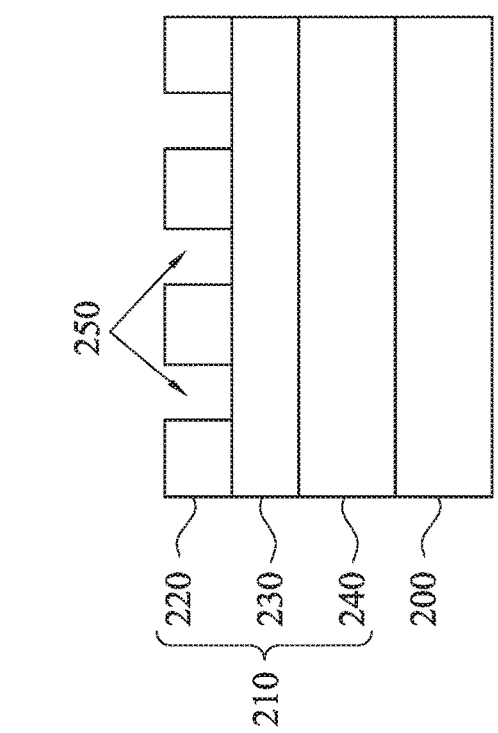

In some embodiments, the photoresist composition described herein is used as an upper layer 220 of a trilayer resist 210 disposed over a substrate 200 or device layer 260, as shown in FIGS. 13A and 13B. The upper layer 220 is made of the photoresist composition including the polymer resin, photoactive compound, organometallic compound, first solvent, and enhancement additive selected from an ionic surfactant, non-ionic surfactant, or second solvent having a boiling point greater than 150° C., as described herein. The trilayer resist 210 also includes a bottom layer 240 and a middle layer 230. In some embodiments, the bottom layer 240 is an organic material having a substantially planar upper surface, and the middle layer 230 is an anti-reflective layer. The photoresist upper layer 210 is patterned using suitable photolithographic operations, as described herein in reference to FIGS. 3A, 3B, 5, 6, 9A, 9B, 10, and 11 to obtain a pattern 250 in the photoresist upper layer 220 as shown in FIGS. 14A and 14B.

In some embodiments, the bottom layer 240 is organic. The organic material may include a plurality of monomers or polymers that are not cross-linked. In some embodiments, the bottom layer 240 contains a material that is patternable and/or has a composition tuned to provide anti-reflection properties. Exemplary materials for the bottom layer 240 include carbon backbone polymers. The bottom layer 240 is used to planarize the structure, as the underlying structure may be uneven depending on the structure of devices in an underlying device layer 260. In some embodiments, the bottom layer 240 is formed by a spin coating process. In other embodiments, the first bottom layer 240 is formed by another suitable deposition process. In certain embodiments, the thickness of the bottom layer 240 ranges from about 50 nm to about 500 nm.

The middle layer 230 of the trilayer resist structure may have a composition that provides anti-reflective properties for the photolithography operation and/or hard mask properties. In some embodiments, the middle layer 230 includes a silicon containing layer (e.g., a silicon hard mask material). The middle layer 230 may include a silicon-containing inorganic polymer. In other embodiments, the middle layer includes a siloxane polymer. In other embodiments, the middle layer 230 includes silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials. The middle layer 230 may be bonded to adjacent layers, such as by covalent bonding, hydrogen bonding, or hydrophilic-to-hydrophilic forces.

Thus, the middle layer 230 may include a composition that allows for a covalent bond to be formed between the middle layer and the overlying photoresist layer 220 after an exposure process and/or subsequent baking process. In some embodiments, the middle layer 230 includes an additive compound or component having a photo base generator (PBG). This PBG generates a base that interacts with the exposed photoresist and provides for covalent bonding between the middle layer and a component of the overlying photoresist. In some embodiments, the middle layer 230 comprises a siloxane polymer and a PBG.

Figure 15B:
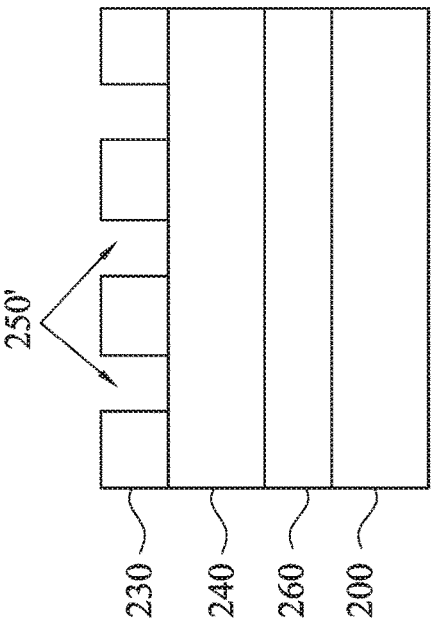
FIGS. 15A and 15B show process stages of sequential operations according to embodiments of the disclosure.
Figure 15A:
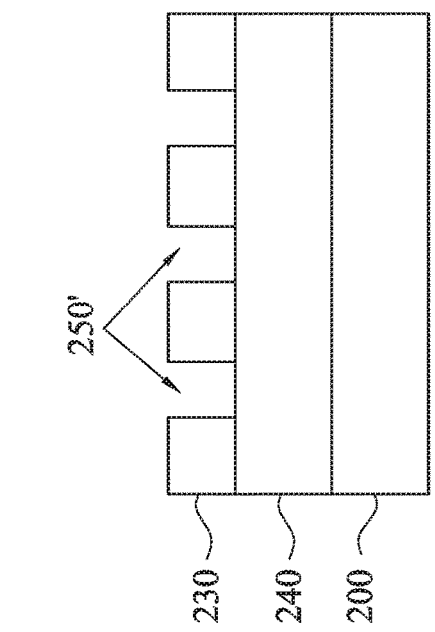

In some embodiments, the pattern 250 in the photoresist upper layer 220 is extended through the middle layer 230 forming a pattern 250' in the middle layer using a suitable etching technique to expose the bottom layer 240, and the upper layer is removed, as shown in FIGS. 15A and 15B.

Figure 16B:
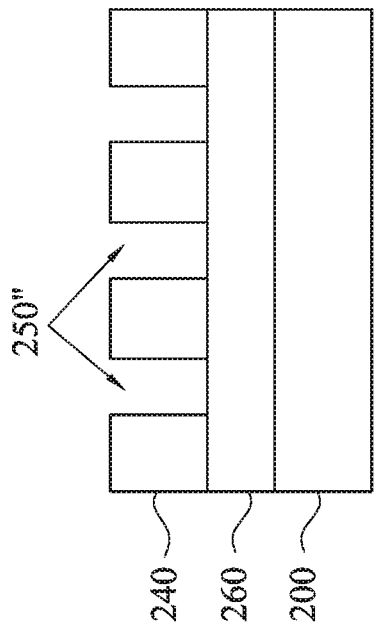
FIGS. 16A and 16B show process stages of sequential operations according to embodiments of the disclosure.
Figure 17B:
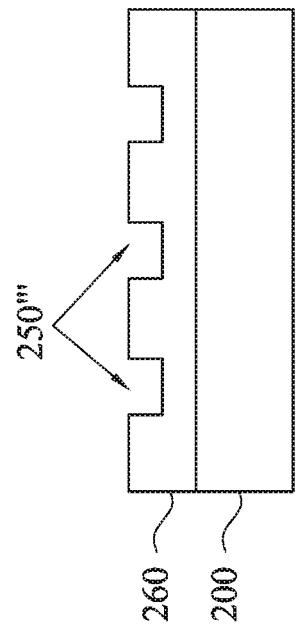
FIGS. 17A and 17B show process stages of sequential operations according to embodiments of the disclosure.
Figure 16A:
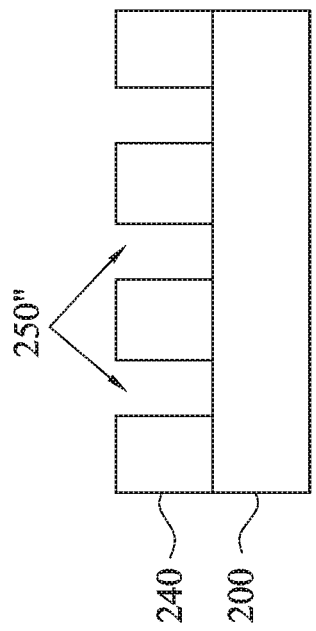
Figure 17A:
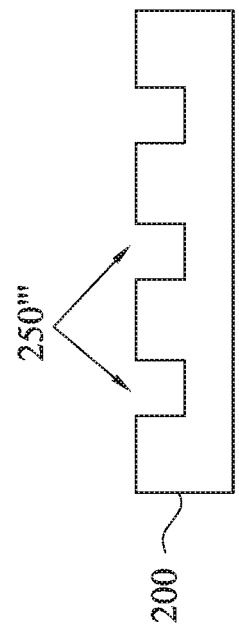

In some embodiments, the pattern 250' in the middle layer 230 is extended through the bottom layer 240 forming a pattern 250" in the bottom layer using a suitable etching technique to expose the substrate 200 or a device layer 260 disposed over the substrate 200, as shown in FIGS. 16A and 16B. In some embodiments, the pattern 250" in the bottom layer 240 is extended into the substrate 200 or device layer 260 using a suitable etching technique. The middle layer and bottom layers are removed using a suitable etching or stripping operation to provide substrate 200 or device layer 260 with the pattern 250''', as shown in FIGS. 17A and 17B.

The novel photoresist and developer compositions, and photolithographic patterning methods according to the present disclosure provide higher semiconductor device feature resolution and density with reduced defects in a higher efficiency process than conventional developers and techniques. The novel photoresist and developer compositions provide improved sensitivity of the photoresist composition, thereby allowing reduced exposure doses to be used. In some embodiments, patterns with less than a 40 nm pitch and less than 5 nm line width resolution are formed with about 70 mJ to about 10 mJ exposure dose energy. In some embodiments, the exposure dose energy is reduced about 3% to about 40% compared to the exposure dose energy required to pattern photoresists not using the enhancement additive of the present disclosure.

An embodiment of the disclosure is a photoresist composition, including a polymer resin, a photoactive compound, an organometallic compound, an enhancement additive, and a first solvent. The enhancement additive is an ionic surfactant, a non-ionic surfactant, or a second solvent having a boiling point of greater than 150° C. In an embodiment, the ionic surfactant is one or more selected from:

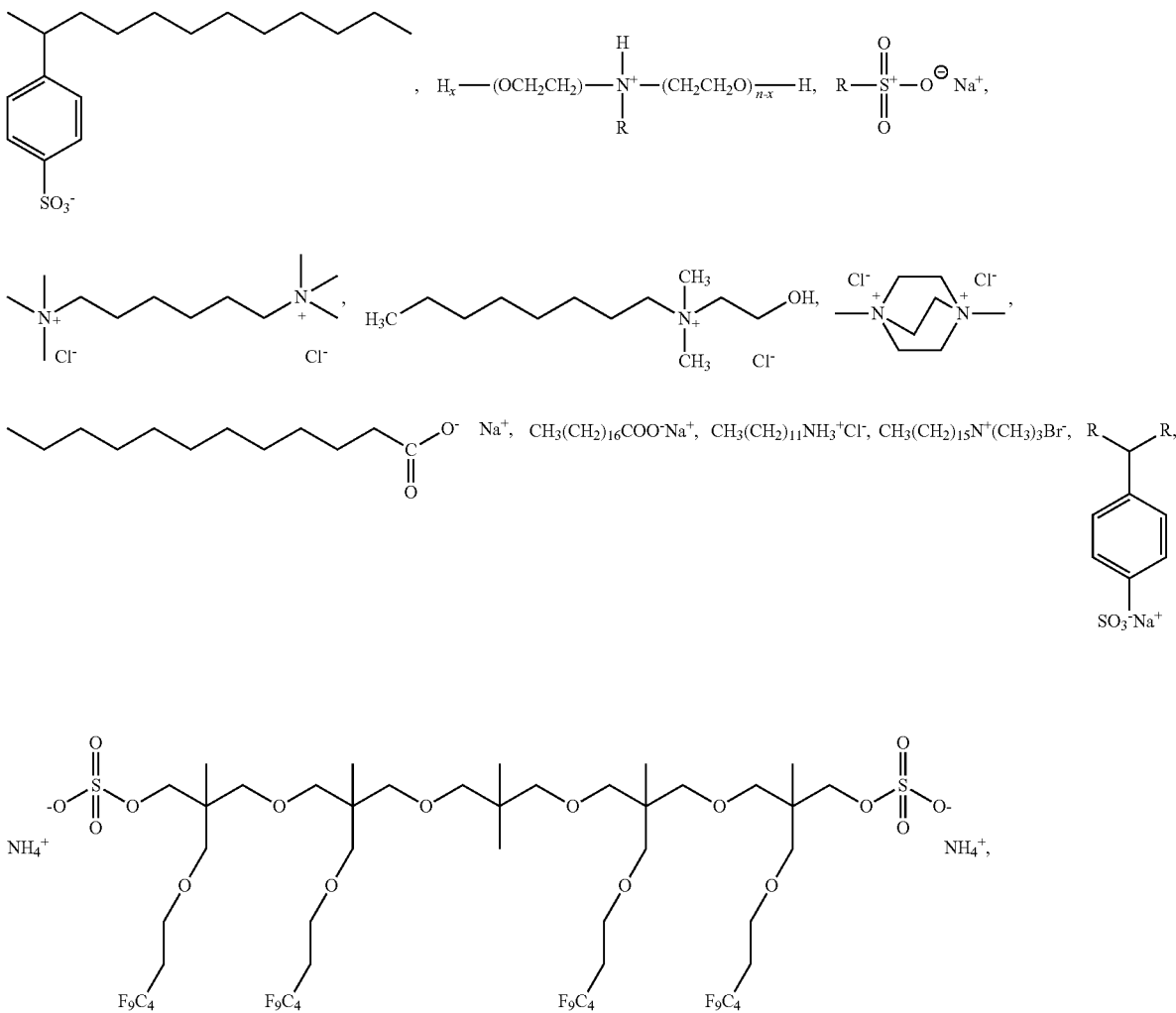

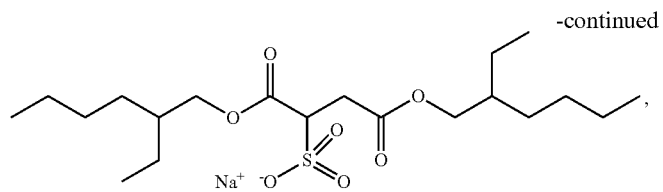

wherein R is a substituted or unsubstituted C1-C12 alkyl, C1-C12 aryl, or C1-C12 aralkyl. In an embodiment, the non-ionic surfactant is one or more selected from:

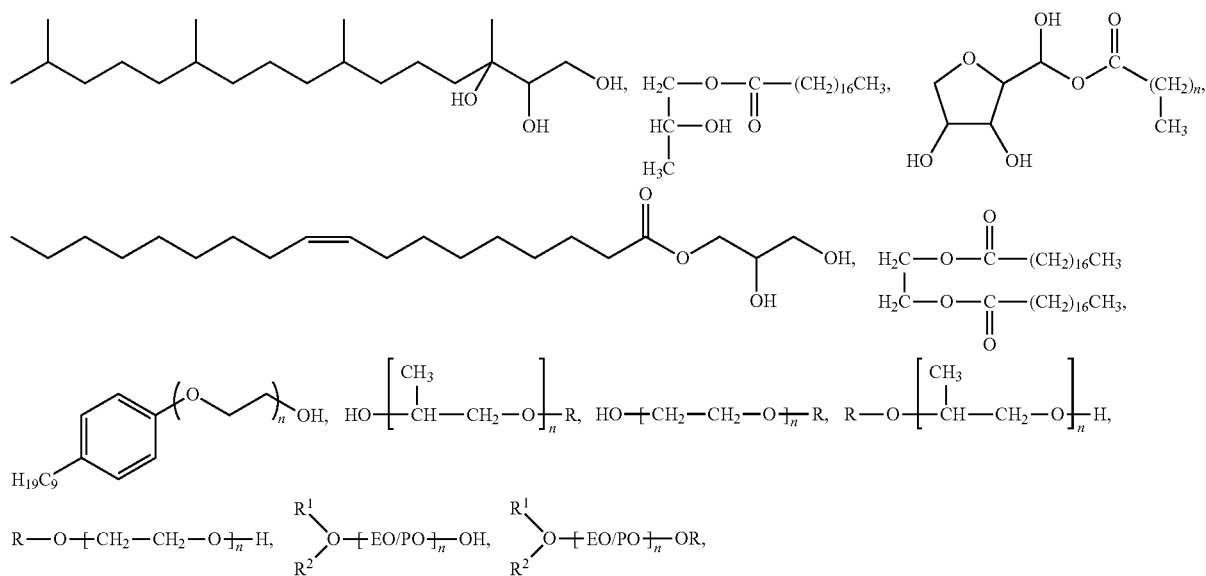

wherein R, $R^1$, and $R^2$ are the same or different and are a substituted or unsubstituted C1-C25 alkyl, C1-C25 aryl, or C1-C25 aralkyl; and EO/PO is ethylene oxide, propylene oxide, or a copolymer of ethylene oxide and propylene oxide. In an embodiment, the second solvent having a boiling point of greater than 150° C. is one or more selected from: cyclohexyl acetate, dipropylene glycol dimethyl ether, propylene glycol diacetate, dipropylene glycol methyl propylene ether, di(propylene glycol) methyl ether acetate, 1,4-diacetoxybutane, 1,3-butanediol diacetate, 1,6-diacetoxyhexane, tripropylene glycol methyl ether, 1,3-propanediol, propylene glycol, 1,3-butanediol, propylene glycol butyl ether, dipropylene glycol monomethyl ether, diethylene glycol monoethyl ether, di(propylene glycol) butyl ether, tri(propylene glycol) butyl ether,

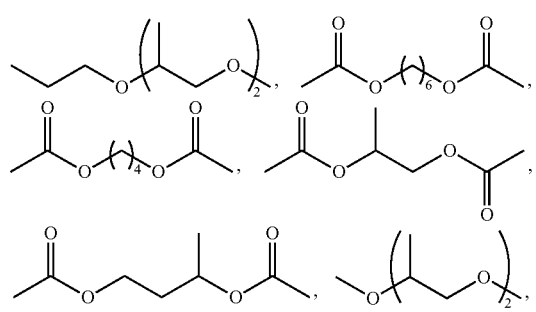

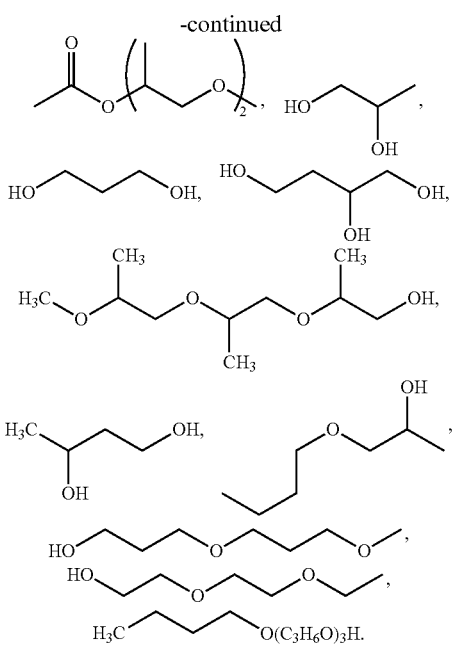

In an embodiment, a concentration of the second solvent having a boiling point of greater than 150° C. is 3 wt. % to 100 wt. % of the total weight of the second solvent and the first solvent. In an embodiment, a concentration of the ionic surfactant or non-ionic surfactant is 10 ppm to 1,000 ppm based on the total weight of the ionic surfactant or non-ionic surfactant and the first solvent. In an embodiment, the organometallic compound comprises a metal oxide nanoparticle and one or more organic ligands. In an embodiment, the first solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK). In an embodiment, the photoresist composition includes water at a concentration of 10 ppm to 250 ppm based on the total composition of the water, enhancement additive, and first solvent.

Another embodiment of the disclosure is a photoresist developer composition, including an enhancement additive and a first solvent. The enhancement additive is an ionic surfactant, a non-ionic surfactant, or a second solvent having a boiling point of greater than 150° C. In an embodiment, the ionic surfactant is one or more selected from:

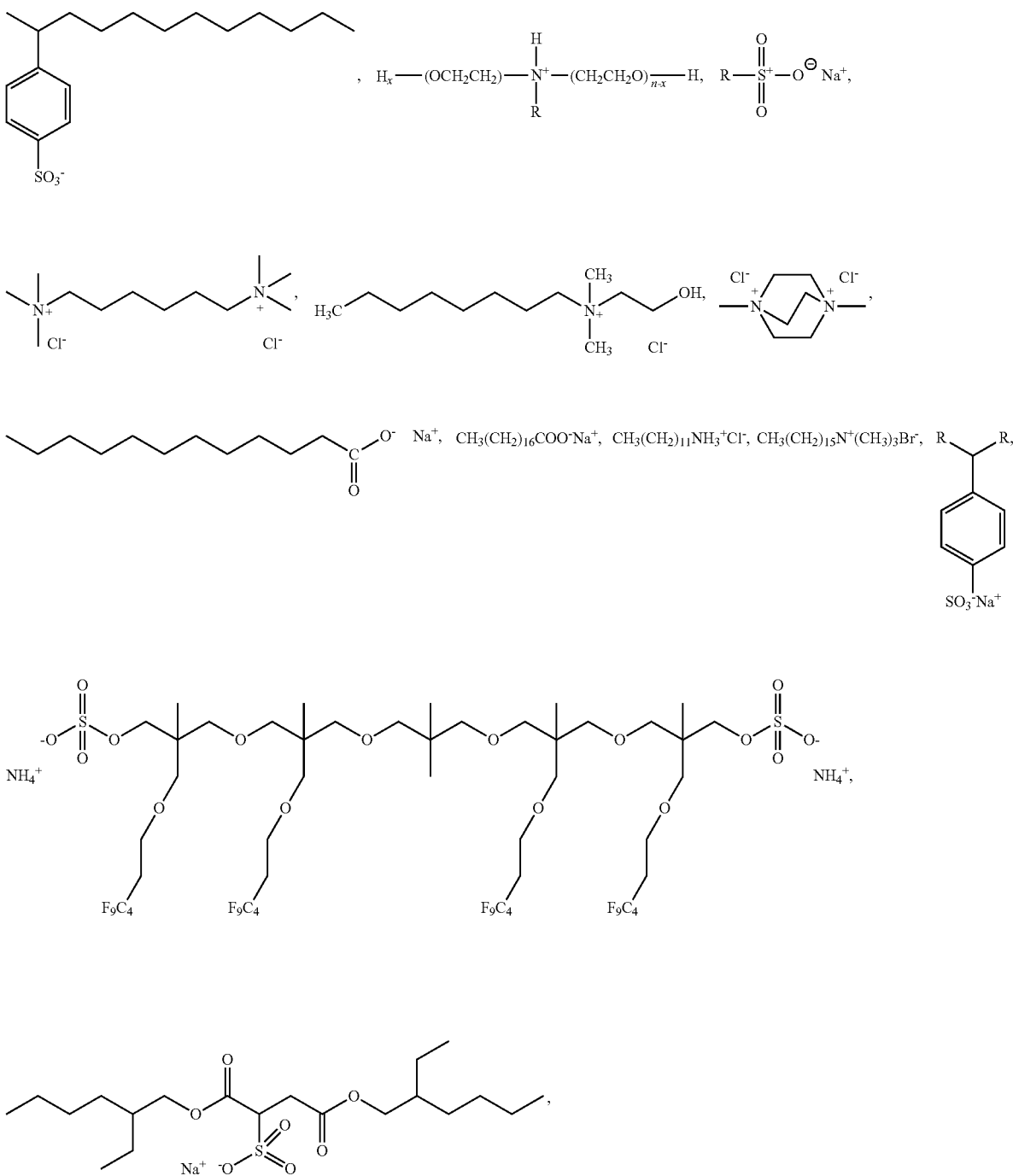

wherein R is a substituted or unsubstituted C1-C12 alkyl, C1-C12 aryl, or C1-C12 aralkyl. In an embodiment, the non-ionic surfactant is one or more selected from:

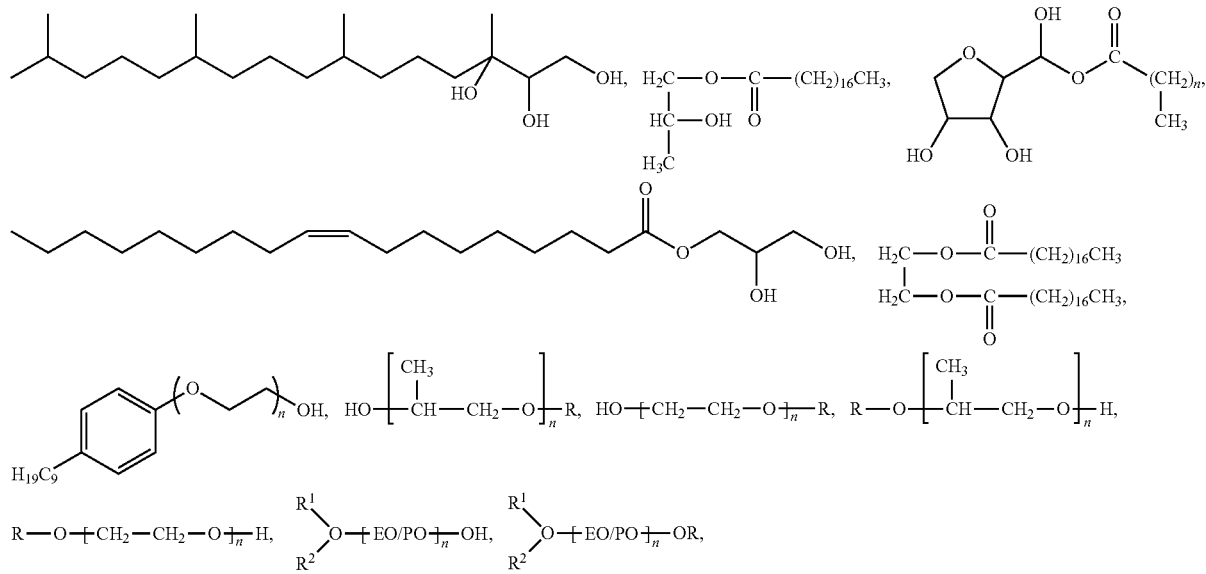

wherein R, R$^1$, and R$^2$ are the same or different and are a substituted or unsubstituted C1-C25 alkyl, C1-C25 aryl, or C1-C25 aralkyl; and EO/PO is ethylene oxide, propylene oxide, or a copolymer of ethylene oxide and propylene oxide. In an embodiment, the second solvent having a boiling point of greater than 150° C. is one or more selected from: cyclohexyl acetate, dipropylene glycol dimethyl ether, propylene glycol diacetate, dipropylene glycol methyl propylene ether, di(propylene glycol) methyl ether acetate, 1,4-diacetoxybutane, 1,3-butanediol diacetate, 1,6-diacetoxyhexane, tripropylene glycol methyl ether, 1,3-propanediol, propylene glycol, 1,3-butanediol, propylene glycol butyl ether, dipropylene glycol monomethyl ether, diethylene glycol monoethyl ether, di(propylene glycol) butyl ether, tri(propylene glycol) butyl ether,

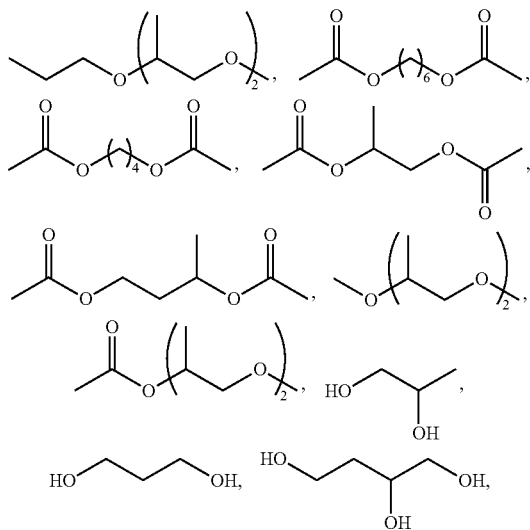

-continued

In an embodiment, a concentration of the second solvent having a boiling point of greater than 150° C. is 0.1 wt. % to 30 wt. % of the total weight of the second solvent and the first solvent. In an embodiment, a concentration of the ionic surfactant or non-ionic surfactant is 10 ppm to 1,000 ppm based on the total weight of the developer composition.

Another embodiment of the disclosure is a method of forming a pattern in a photoresist, including forming a photoresist composition layer on a substrate and selectively exposing the photoresist layer to actinic radiation to form a latent pattern. The latent pattern is developed by applying a developer to the selectively exposed photoresist layer to form a pattern. The photoresist composition includes a polymer resin, a photoactive compound, an organometallic compound, an enhancement additive, and a first solvent. The enhancement additive is an ionic surfactant, a non-ionic surfactant, or a second solvent having a boiling point of greater than 150° C., and a first solvent. In an embodiment, the ionic surfactant is one or more selected from:

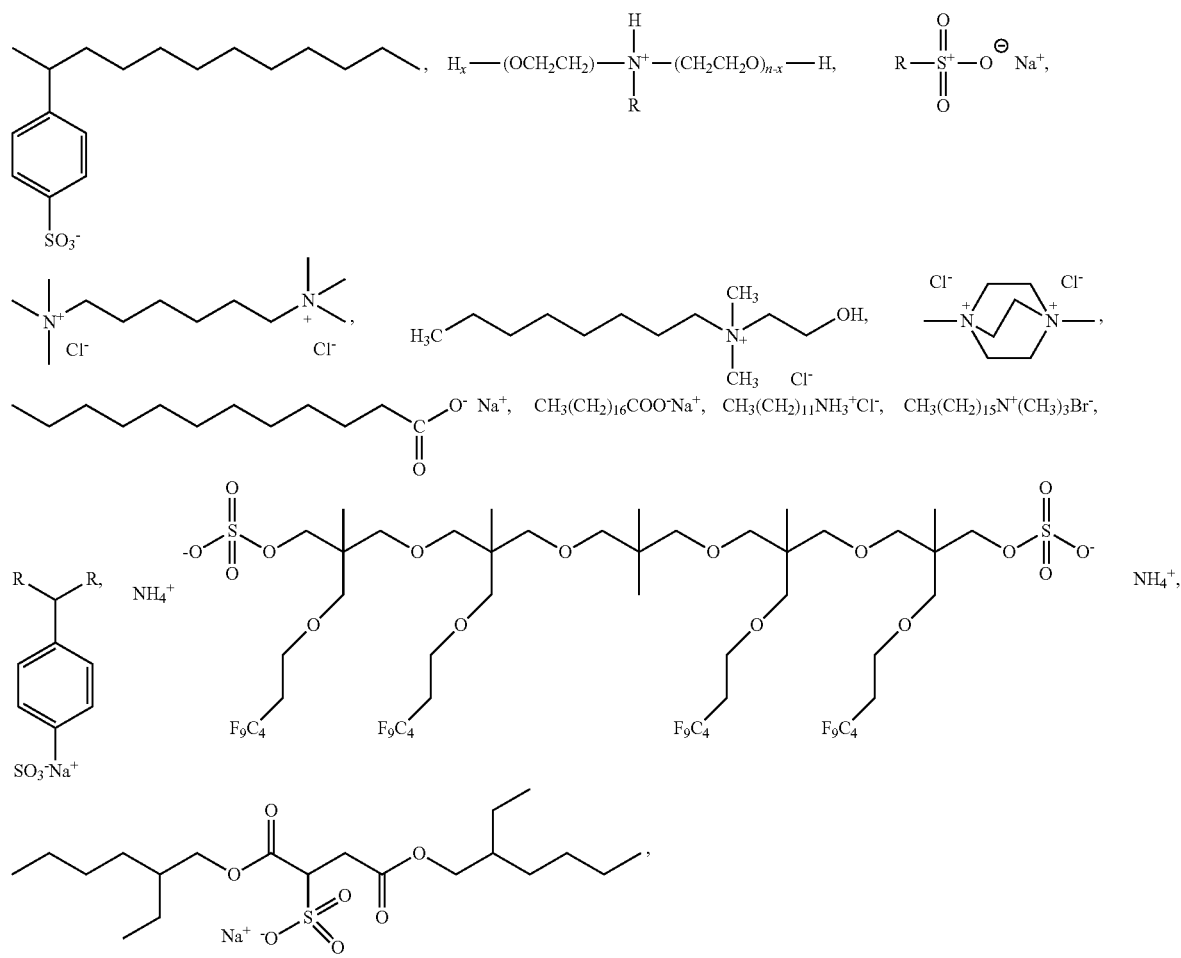
wherein R is a substituted or unsubstituted C1-C12 alkyl, C1-C12 aryl, or C1-C12 aralkyl, or the like. In an embodiment, the non-ionic surfactant is one or more selected from:
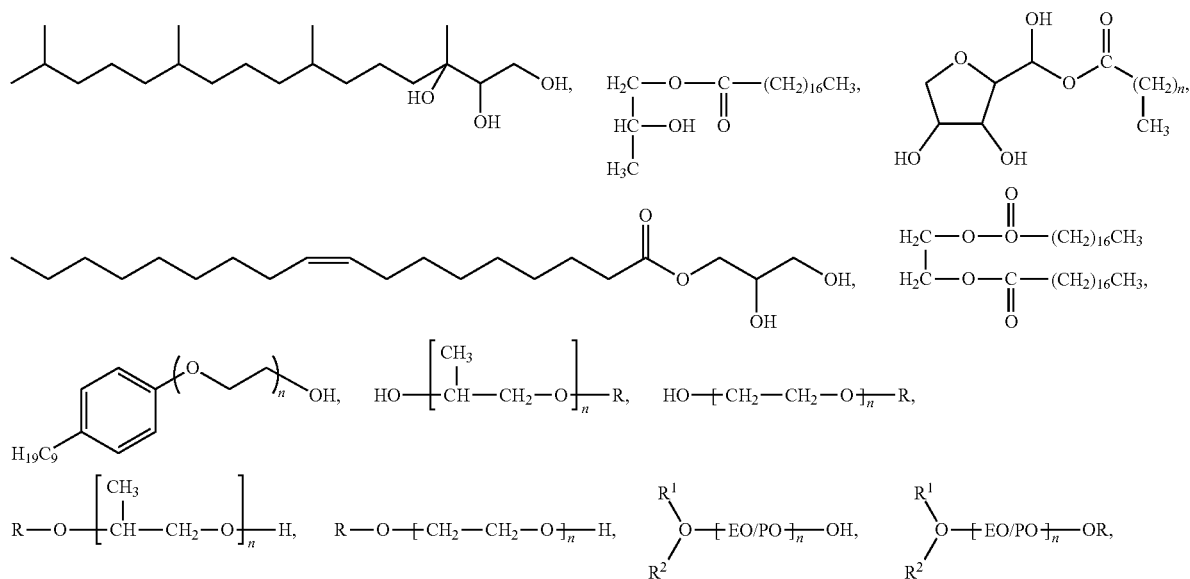

wherein R, $R^1$, and $R^2$ are the same or different and are a substituted or unsubstituted C1-C25 alkyl, C1-C25 aryl, or C1-C25 aralkyl; and EO/PO is ethylene oxide, propylene oxide, or a copolymer of ethylene oxide and propylene oxide. In an embodiment, the second solvent having a boiling point of greater than 150° C. is one or more selected from: cyclohexyl acetate, dipropylene glycol dimethyl ether, propylene glycol diacetate, dipropylene glycol methyl propylene ether, di(propylene glycol) methyl ether acetate, 1,4-diacetoxybutane, 1,3-butanediol diacetate, 1,6-diacetoxyhexane, tripropylene glycol methyl ether, 1,3-propanediol, propylene glycol, 1,3-butanediol, propylene glycol butyl ether, dipropylene glycol monomethyl ether, diethylene glycol monoethyl ether, di(propylene glycol) butyl ether, tri(propylene glycol) butyl ether,

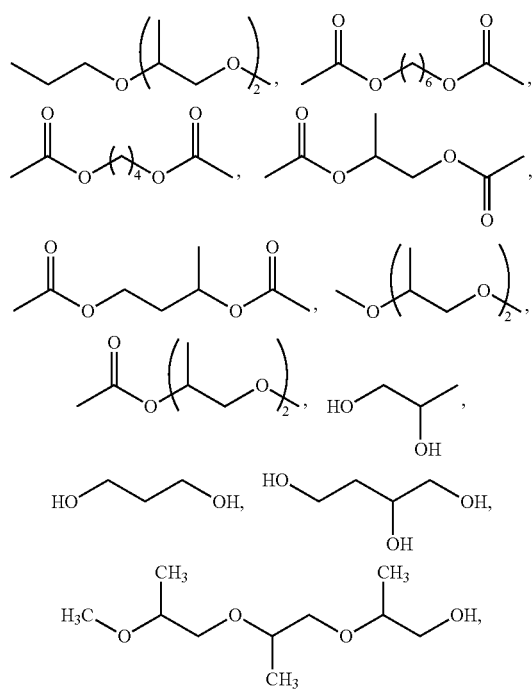

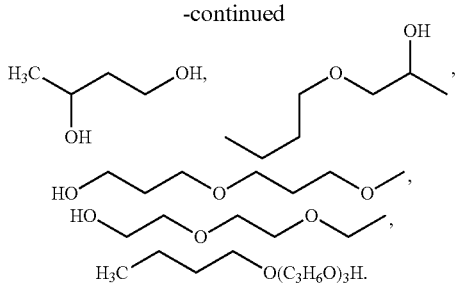

In an embodiment, a concentration of the second solvent having a boiling point of greater than 150° C. is 3 wt. % to 100 wt. % of the total weight of the second solvent and the first solvent. In an embodiment, a concentration of the ionic surfactant or non-ionic surfactant is 10 ppm to 1,000 ppm based on the total weight of the ionic surfactant or non-ionic surfactant and the first solvent. In an embodiment, the organometallic compound comprises a metal oxide nanoparticle and one or more organic ligands. In an embodiment, the first solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK). In an embodiment, the photoresist composition includes water at a concentration of 10 ppm to 250 ppm based on the total composition of the water, enhancement additive, and first solvent. In an embodiment, the developer includes the enhancement additive and a developer solvent.

In an embodiment of the disclosure, a method of forming a pattern in a photoresist, includes forming a photoresist composition layer on a substrate and selectively exposing the photoresist layer to actinic radiation to form a latent pattern. The latent pattern is developed by applying a developer to the selectively exposed photoresist layer to form a pattern. The developer includes an enhancement additive and a developer solvent. The enhancement additive is an ionic surfactant, a non-ionic surfactant, or a second solvent having a boiling point of greater than 150° C. In an embodiment, the ionic surfactant is one or more selected from:

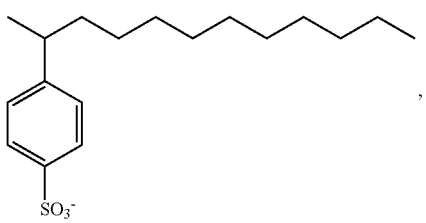

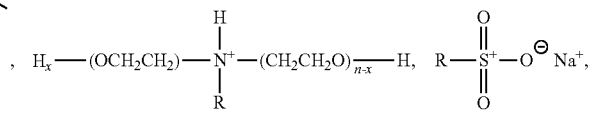

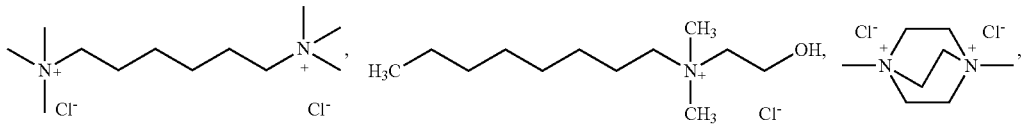

-continued
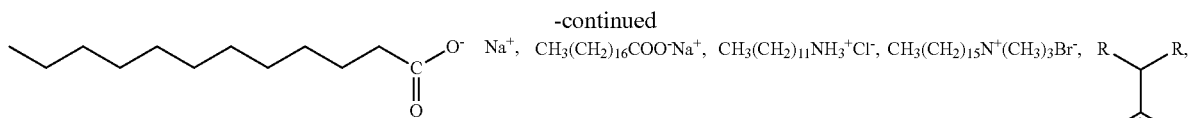
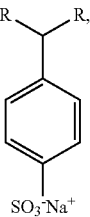
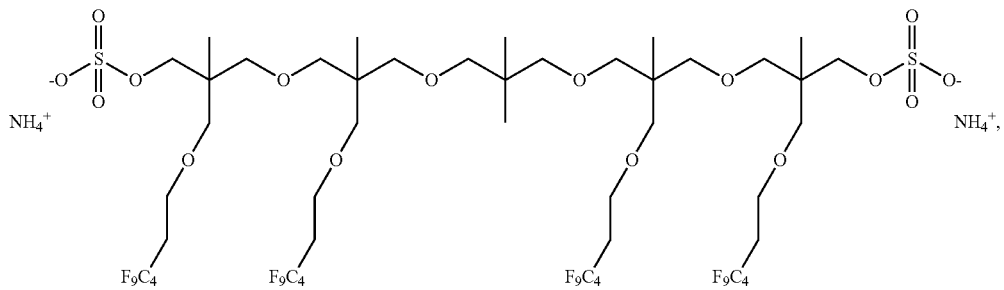
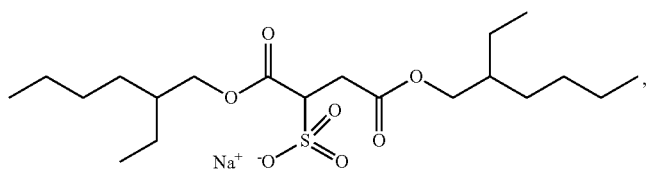
wherein R is a substituted or unsubstituted C1-C12 alkyl, C1-C12 aryl, C1-C12 aralkyl, or the like. In an embodiment, the non-ionic surfactant is one or more selected from:
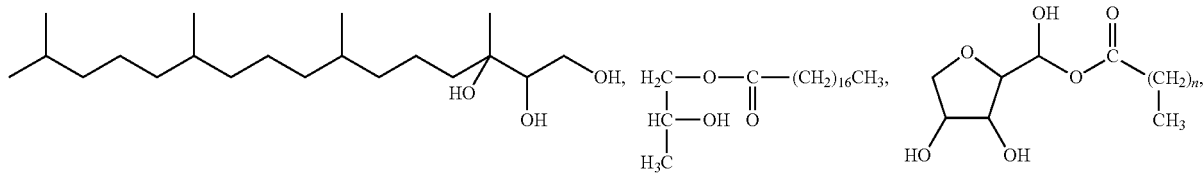
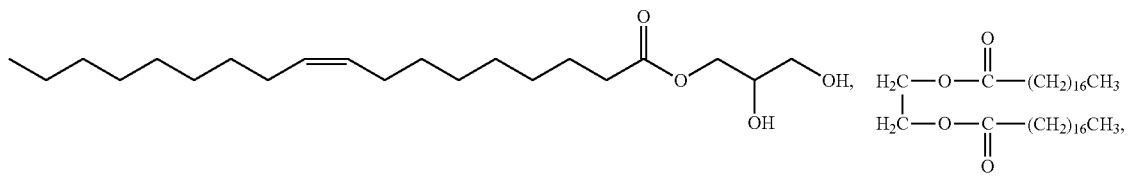
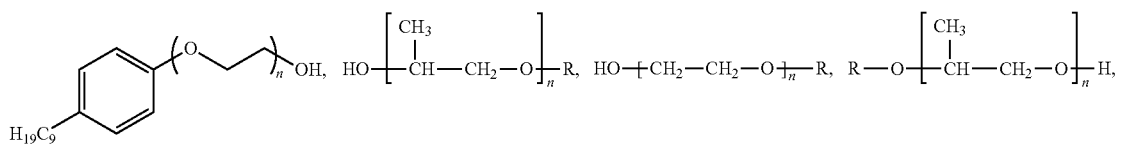
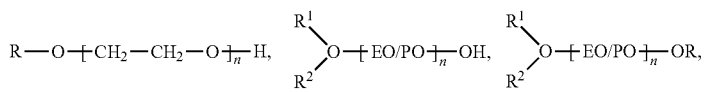

wherein R, $R^1$, and $R^2$ are the same or different and are a substituted or unsubstituted C1-C25 alkyl, C1-C25 aryl, or C1-C25 aralkyl; and EO/PO is ethylene oxide, propylene oxide, or a copolymer of ethylene oxide and propylene oxide. In an embodiment, the second solvent having a boiling point of greater than 150° C. is one or more selected from: cyclohexyl acetate, dipropylene glycol dimethyl ether, propylene glycol diacetate, dipropylene glycol methyl propylene ether, di(propylene glycol) methyl ether acetate, 1,4-diacetoxybutane, 1,3-butanediol diacetate, 1,6-diacetoxyhexane, tripropylene glycol methyl ether, 1,3-propanediol, propylene glycol, 1,3-butanediol, propylene glycol butyl ether, dipropylene glycol monomethyl ether, diethylene glycol monoethyl ether, di(propylene glycol) butyl ether, tri(propylene glycol) butyl ether,

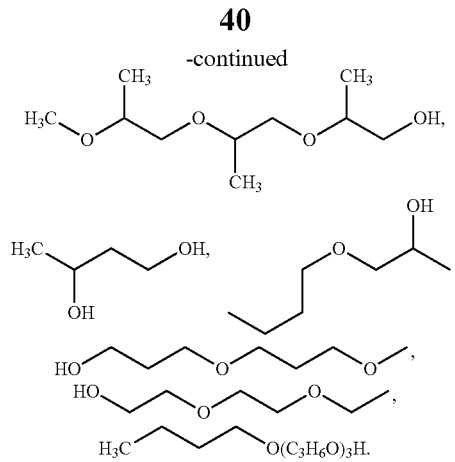

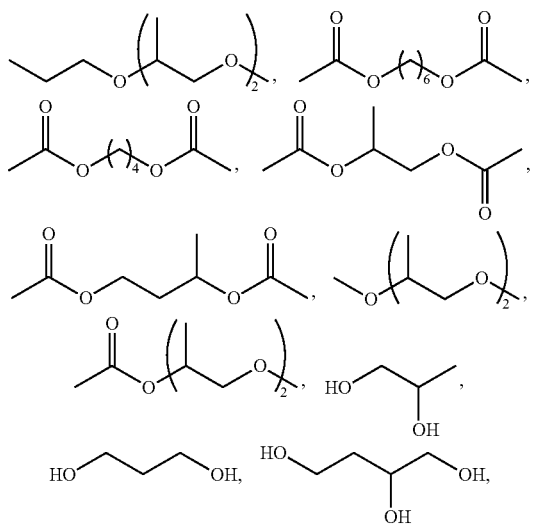

In an embodiment, a concentration of the second solvent having a boiling point of greater than 150° C. is 0.1 wt. % to 30 wt. % of the total weight of the second solvent and the developer solvent. In an embodiment, a concentration of the ionic surfactant or non-ionic surfactant is 10 ppm to 1,000 ppm based on the total weight of the developer.

Another embodiment of the disclosure is a method of forming a pattern, including forming a bottom layer of a trilayer resist on a substrate. A middle layer of the trilayer resist is formed over the bottom layer of the trilayer resist. An upper layer of the trilayer resist is formed over the middle layer of the trilayer resist. The upper layer is selectively exposed to actinic radiation to form a latent pattern. The latent pattern is developed by applying a developer to the selectively exposed upper layer to form a pattern. The upper layer is made of a photoresist composition, including a polymer resin, a photoactive compound, an organometallic compound, an enhancement additive, and a first solvent. The enhancement additive is an ionic surfactant, a non-ionic surfactant, or a second solvent having a boiling point of greater than 150° C. In an embodiment, the ionic surfactant is one or more selected from:

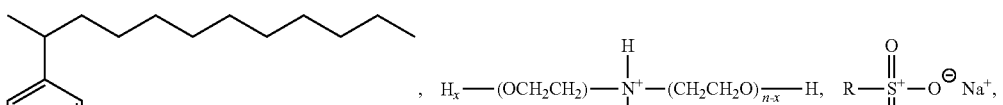

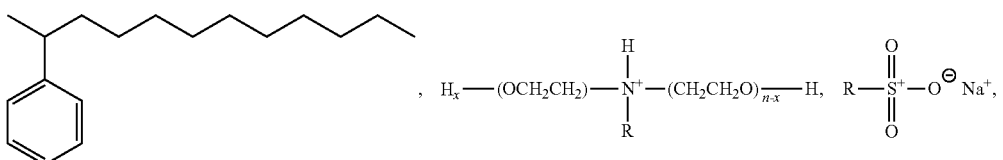

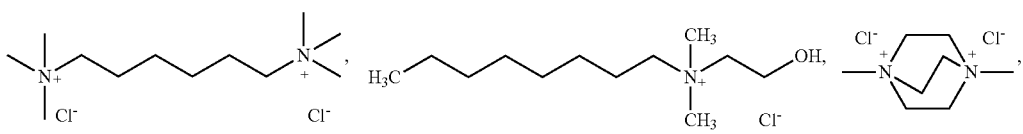

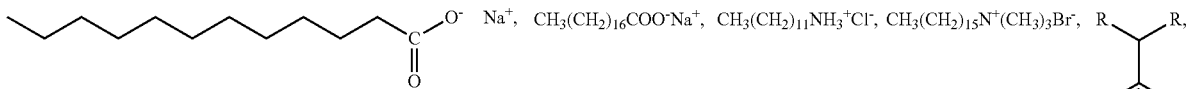
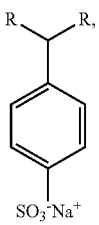

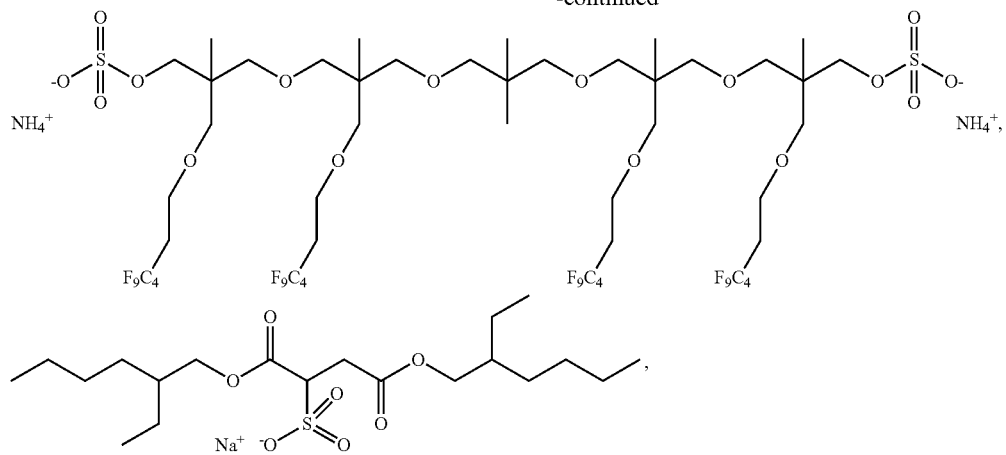

wherein R is a substituted or unsubstituted C1-C12 alkyl, C1-C12 aryl, or C1-C12 aralkyl. In an embodiment, the non-ionic surfactant is one or more selected from:

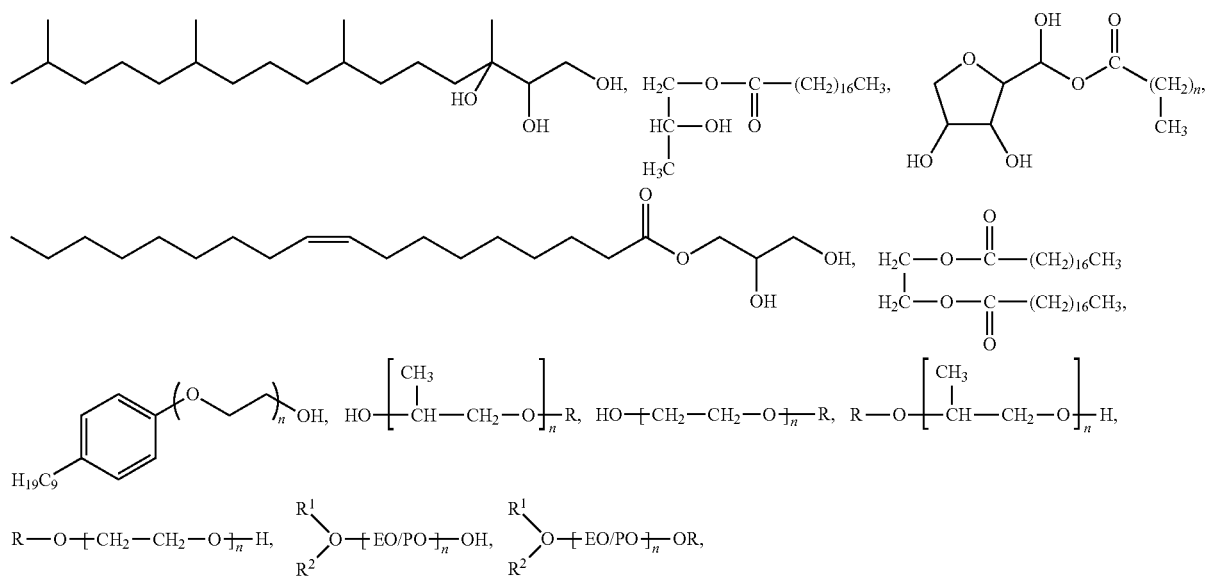

wherein R, $R^1$, and $R^2$ are the same or different and are a substituted or unsubstituted C1-C25 alkyl, C1-C25 aryl, or C1-C25 aralkyl; and EO/PO is ethylene oxide, propylene oxide, or a copolymer of ethylene oxide and propylene oxide. In an embodiment, the second solvent having a boiling point of greater than 150° C. is one or more selected from: cyclohexyl acetate, dipropylene glycol dimethyl ether, propylene glycol diacetate, dipropylene glycol methyl propylene ether, di(propylene glycol) methyl ether acetate, 1,4-diacetoxybutane, 1,3-butanediol diacetate, 1,6-diacetoxyhexane, tripropylene glycol methyl ether, 1,3-propanediol, propylene glycol, 1,3-butanediol, propylene glycol butyl ether, dipropylene glycol monomethyl ether, diethylene glycol monoethyl ether, di(propylene glycol) butyl ether, tri(propylene glycol) butyl ether,

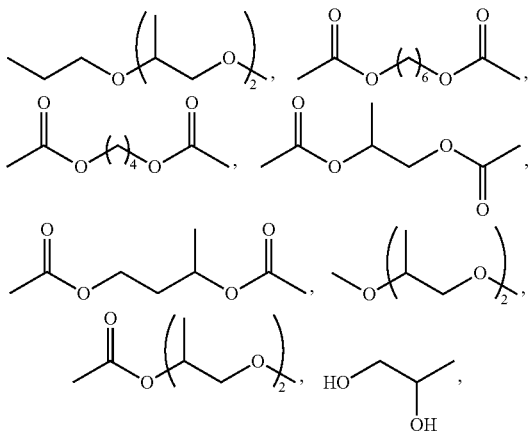

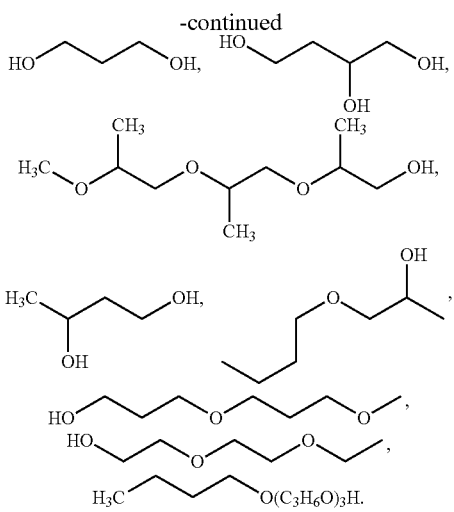

In an embodiment, a concentration of the second solvent having a boiling point of greater than 150° C. is 3 wt. % to 100 wt. % of the total weight of the second solvent and the first solvent. In an embodiment, a concentration of the ionic surfactant or non-ionic surfactant is 10 ppm to 1,000 ppm based on the total weight of the ionic surfactant or non-ionic surfactant and the first solvent. In an embodiment, the organometallic compound comprises a metal oxide nanoparticle and one or more organic ligands. In an embodiment, the first solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK). In an embodiment, the photoresist composition includes water at a concentration of 10 ppm to 250 ppm based on the total composition of the water, enhancement additive, and first solvent. In an embodiment, a device layer including one or more semiconductor devices is disposed between the substrate and the bottom layer. In an embodiment, the method includes an operation of extending the pattern in the upper layer through the middle layer to expose the bottom layer. In an embodiment, the method includes extending the pattern in the middle layer through the bottom layer to expose the substrate. In an embodiment, the method includes extending the pattern in the bottom layer into the substrate. In an embodiment, the method includes removing the trilayer resist. In an embodiment, the middle layer includes a silicon-containing layer. In an embodiment, the middle layer is a hard mask. In an embodiment, the middle layer is an anti-reflective layer. In an embodiment, the middle layer includes a photobase generator. In an embodiment, the bottom layer includes an organic material. In some embodiments, the bottom layer includes a carbon backbone polymer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photoresist composition, comprising:
a polymer resin;
a photoactive compound;
an organometallic compound;
an enhancement additive; and
a first solvent,
wherein the organometallic compound comprises a metal oxide nanoparticle and one or more organic ligands,
wherein the enhancement additive is an ionic surfactant, or a non-ionic surfactant, or a second solvent having a boiling point of greater than 150° C.,
wherein the ionic surfactant is one or more selected from:

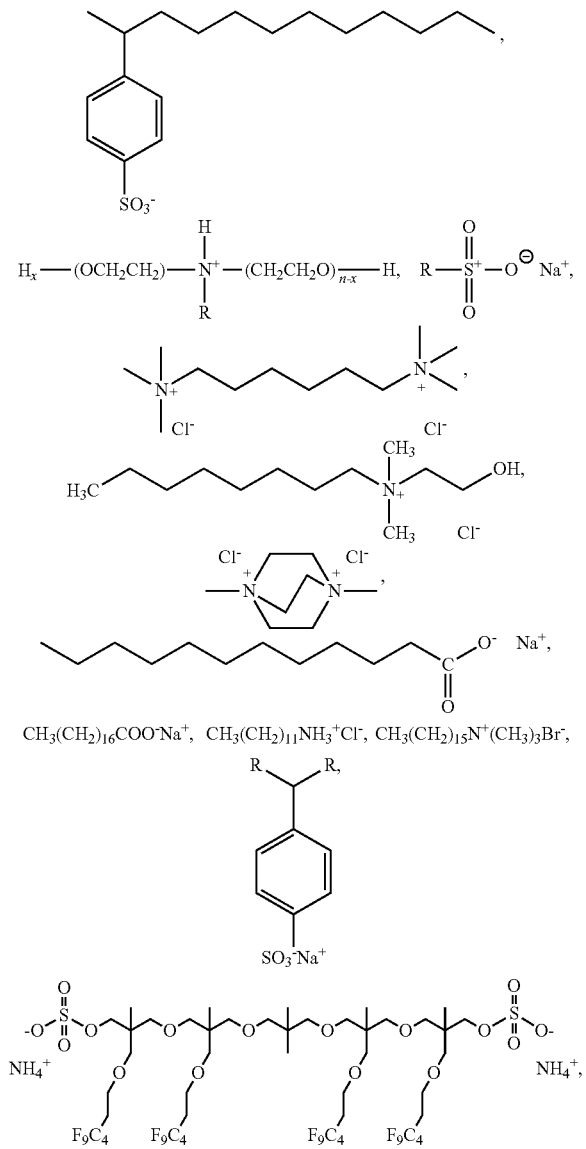

-continued

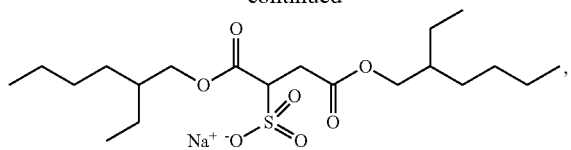

wherein R is a substituted or unsubstituted C1-C12 alkyl, C1-C12 aryl, or C1-C12 aralkyl, wherein the non-ionic surfactant is one or more selected from:

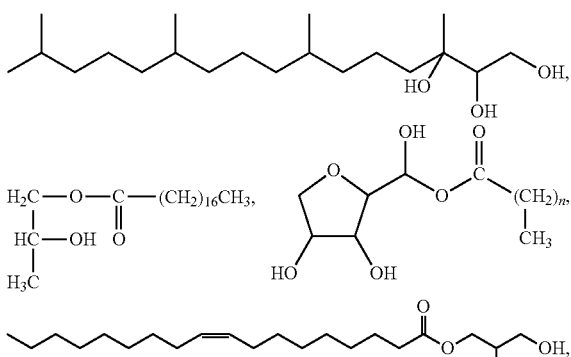

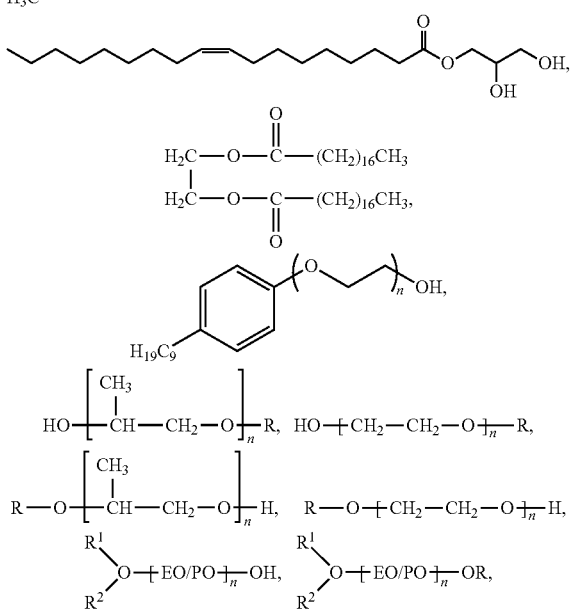

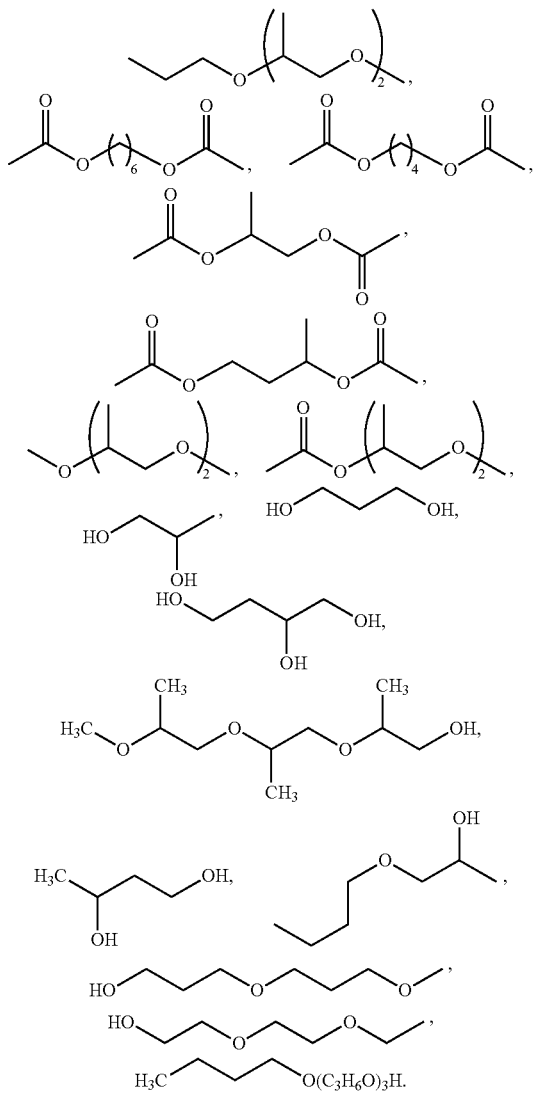

wherein R, $R^1$, and $R^2$ are the same or different and are a substituted or unsubstituted C1-C25 alkyl, C1-C25 aryl, or C1-C25 aralkyl, and EO/PO is ethylene oxide, propylene oxide, or a copolymer of ethylene oxide and propylene oxide, and wherein the second solvent having a boiling point of greater than 150° C. is one or more selected from:

cyclohexyl acetate, dipropylene glycol dimethyl ether, propylene glycol diacetate, dipropylene glycol methyl propylene ether, di(propylene glycol) methyl ether acetate, 1,4-diacetoxybutane, 1,3-butanediol diacetate, 1,6-diacetoxyhexane, tripropylene glycol methyl ether, 1,3-propanediol, propylene glycol, 1,3-butanediol, propylene glycol butyl ether, dipropylene glycol monomethyl ether, diethylene glycol monoethyl ether, di(propylene glycol) butyl ether, tri(propylene glycol) butyl ether, 2. The photoresist composition of claim 1, wherein a concentration of the second solvent having a boiling point of greater than 150° C. is 3 wt. % to 100 wt. % of the total weight of the second solvent and the first solvent.

3. The photoresist composition of claim 1, wherein a concentration of the ionic surfactant or non-ionic surfactant is 10 ppm to 1,000 ppm based on the total weight of the ionic surfactant or non-ionic surfactant and the first solvent.

4. The photoresist composition of claim 1, wherein the first solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

5. The photoresist composition of claim 1, further comprising water at a concentration of 10 ppm to 250 ppm based on the total composition of the water, enhancement additive, and first solvent.

6. The photoresist composition of claim 1, wherein the one or more organic ligands are selected from the group consisting of a carboxylic acid, a sulfonic acid ligand, a methacrylic acid, and ligands including aliphatic or aromatic groups.

7. A photoresist developer composition, comprising:
an enhancement additive;
an organometallic compound; and
a first solvent,
wherein the organometallic compound comprises a metal oxide nanoparticle and one or more organic ligands,
wherein the enhancement additive is an ionic surfactant, or a non-ionic surfactant, or a second solvent having a boiling point of greater than 150° C.,
wherein the ionic surfactant is one or more selected from:

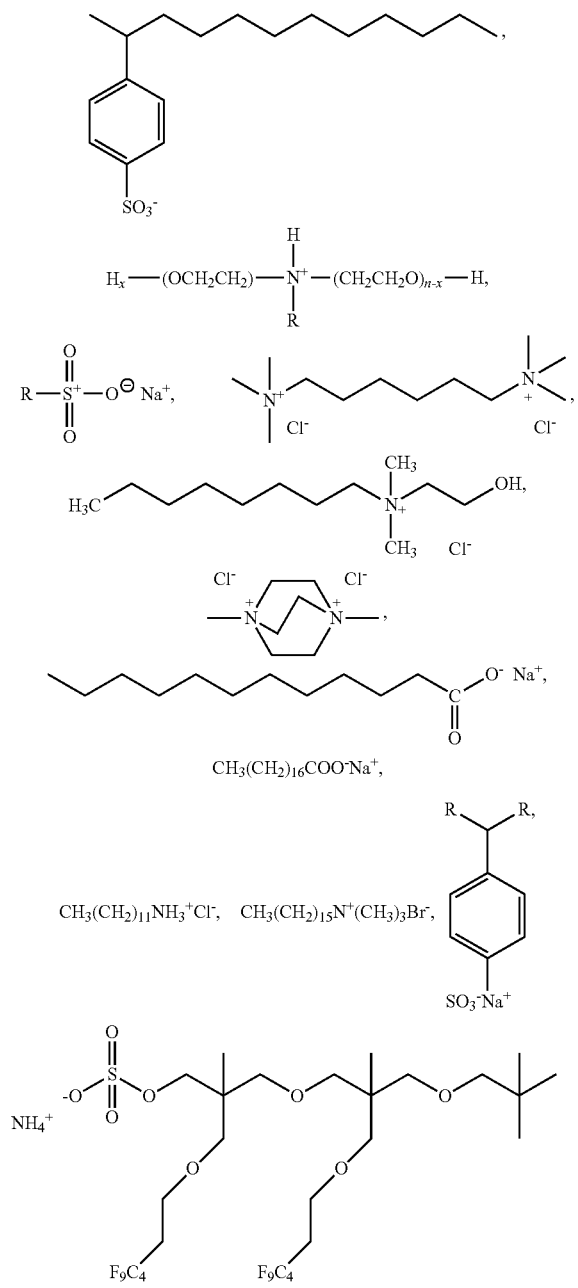

wherein R is a substituted or unsubstituted C1-C12 alkyl, C1-C12 aryl, or C1-C12 aralkyl,
wherein the non-ionic surfactant is one or more selected from:

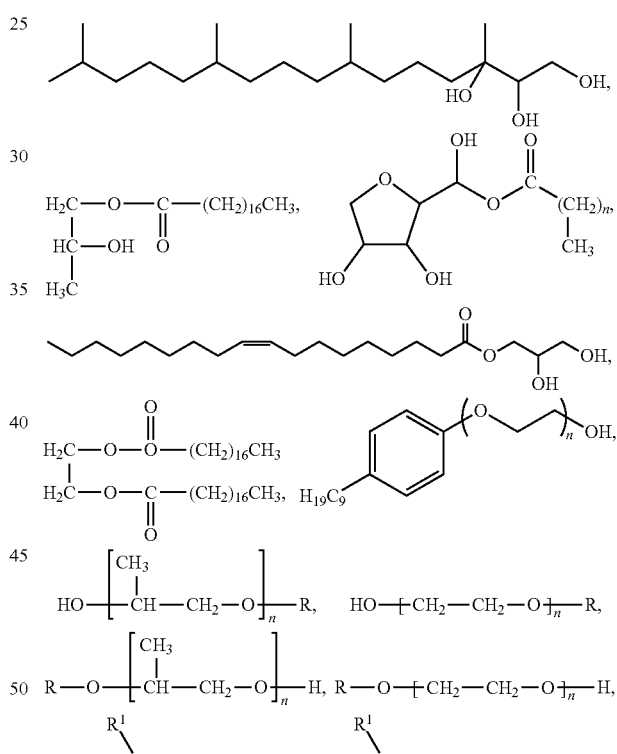

wherein R, $R^1$, and $R^2$ are the same or different and are a substituted or unsubstituted C1-C25 alkyl, C1-C25 aryl, or C1-C25 aralkyl, and EO/PO is ethylene oxide, propylene oxide, or a copolymer of ethylene oxide and propylene oxide, and
wherein the second solvent having a boiling point of greater than 150° C. is one or more selected from:
cyclohexyl acetate, dipropylene glycol dimethyl ether, propylene glycol diacetate, dipropylene glycol methyl propylene ether, di(propylene glycol) methyl ether acetate, 1,4-diacetoxybutane, 1,3-butanediol diacetate, 1,6-diacetoxyhexane, tripropylene glycol methyl ether, 1,3-propanediol, propylene glycol, 1,3-butanediol, propylene glycol butyl ether, dipropylene glycol monomethyl ether, diethylene glycol monoethyl ether, di(propylene glycol) butyl ether, tri(propylene glycol) butyl ether,

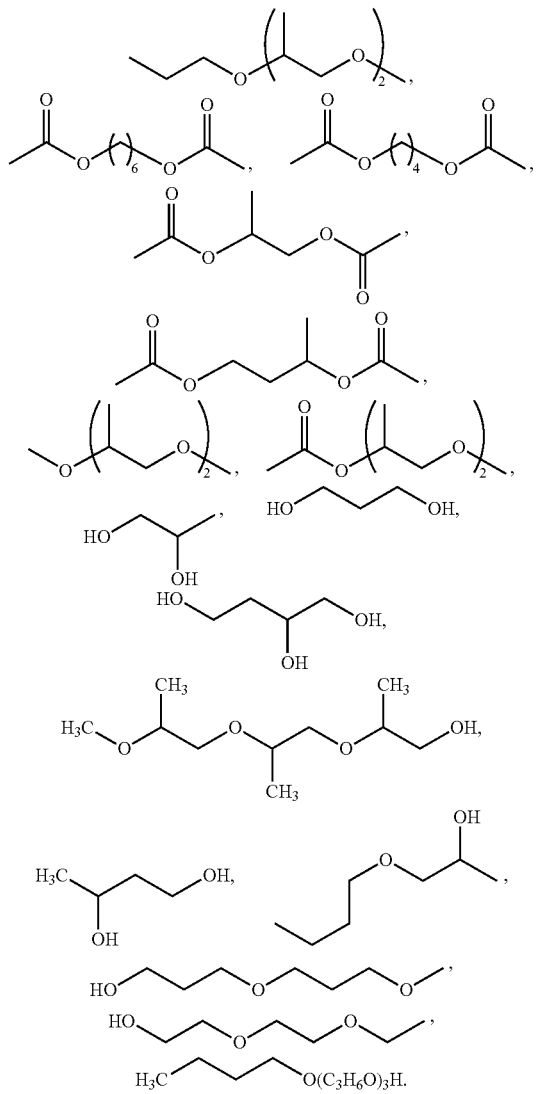

8. The photoresist developer composition of claim 7, wherein a concentration of the second solvent having a boiling point of greater than 150° C. is 0.1 wt. % to 30 wt. % of the total weight of the second solvent and the first solvent.

9. The photoresist developer composition of claim 7, wherein a concentration of the ionic surfactant or non-ionic surfactant is 10 ppm to 1,000 ppm based on the total weight of the developer composition.

10. The photoresist developer composition of claim 7, wherein the first solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

11. The photoresist developer composition of claim 7, further comprising water at a concentration of 10 ppm to 250 ppm based on a total composition of the water, enhancement additive, and the first solvent.

12. The photoresist developer composition of claim 7, wherein a concentration of the first solvent is from about 60 wt. % to about 99 wt. % based on a total weight of the photoresist developer.

13. A method of forming a pattern in a photoresist, comprising:
    forming a photoresist composition layer on a substrate;
    selectively exposing the photoresist layer to actinic radiation to form a latent pattern; and
    developing the latent pattern by applying a developer to the selectively exposed photoresist layer to form a pattern,
    wherein the photoresist composition comprises:
    a polymer resin;
    a photoactive compound;
    an organometallic compound;
    an enhancement additive; and
    a first solvent,
    wherein the organometallic compound comprises a metal oxide nanoparticle and one or more organic ligands,
    wherein the enhancement additive is an ionic surfactant, or a non-ionic surfactant, or a second solvent having a boiling point of greater than 150° C.,
    wherein the ionic surfactant is one or more selected from:

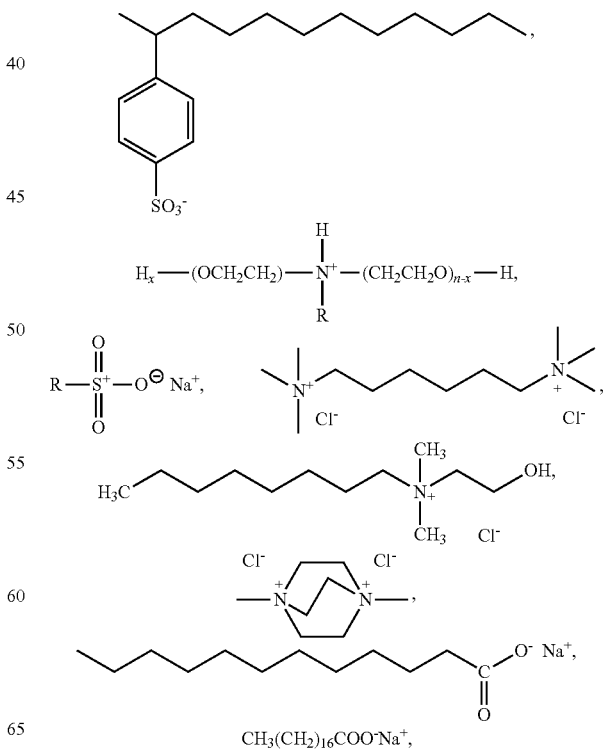

-continued

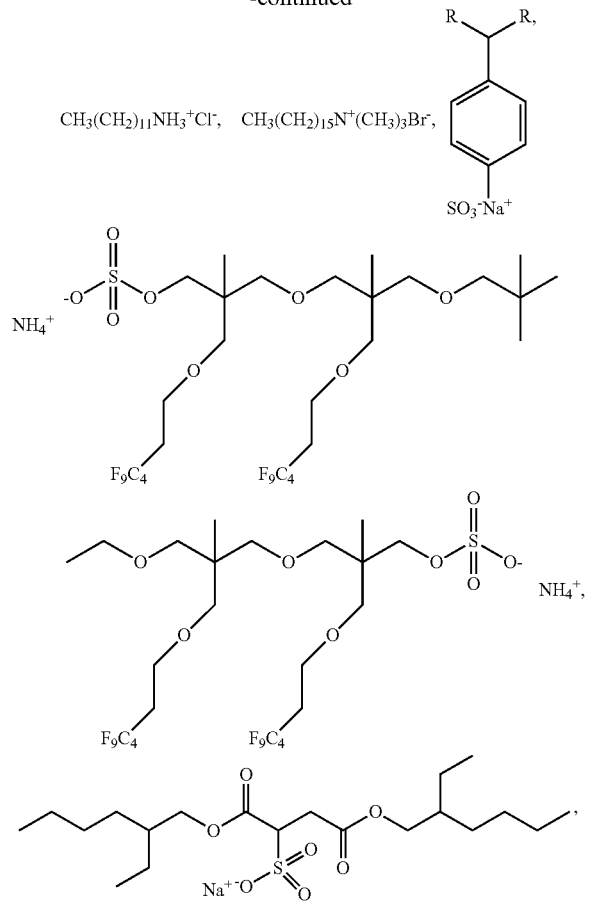

wherein R is a substituted or unsubstituted C1-C12 alkyl, C1-C12 aryl, or C1-C12 aralkyl, wherein the non-ionic surfactant is one or more selected from:

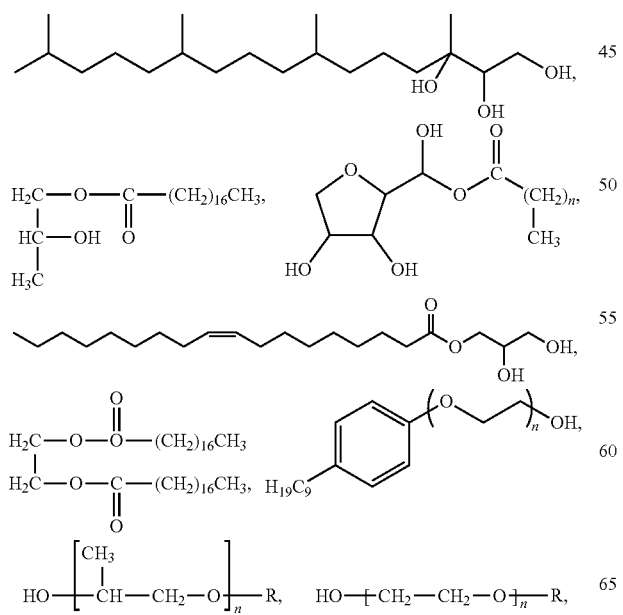

-continued

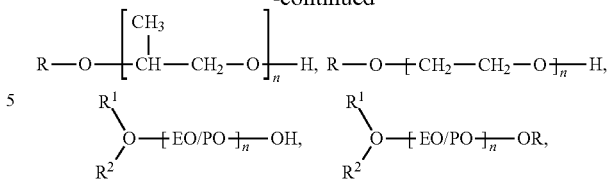

wherein R, R¹, and R² are the same or different and are a substituted or unsubstituted C1-C25 alkyl, C1-C25 aryl, or C1-C25 aralkyl; and EO/PO is ethylene oxide, propylene oxide, or a copolymer of ethylene oxide and propylene oxide, and wherein the second solvent having a boiling point of greater than 150° C. is one or more selected from:

cyclohexyl acetate, dipropylene glycol dimethyl ether, propylene glycol diacetate, dipropylene glycol methyl propylene ether, di(propylene glycol) methyl ether acetate, 1,4-diacetoxybutane, 1,3-butanediol diacetate, 1,6-diacetoxyhexane, tripropylene glycol methyl ether, 1,3-propanediol, propylene glycol, 1,3-butanediol, propylene glycol butyl ether, dipropylene glycol monomethyl ether, diethylene glycol monoethyl ether, di(propylene glycol) butyl ether, tri(propylene glycol) butyl ether,

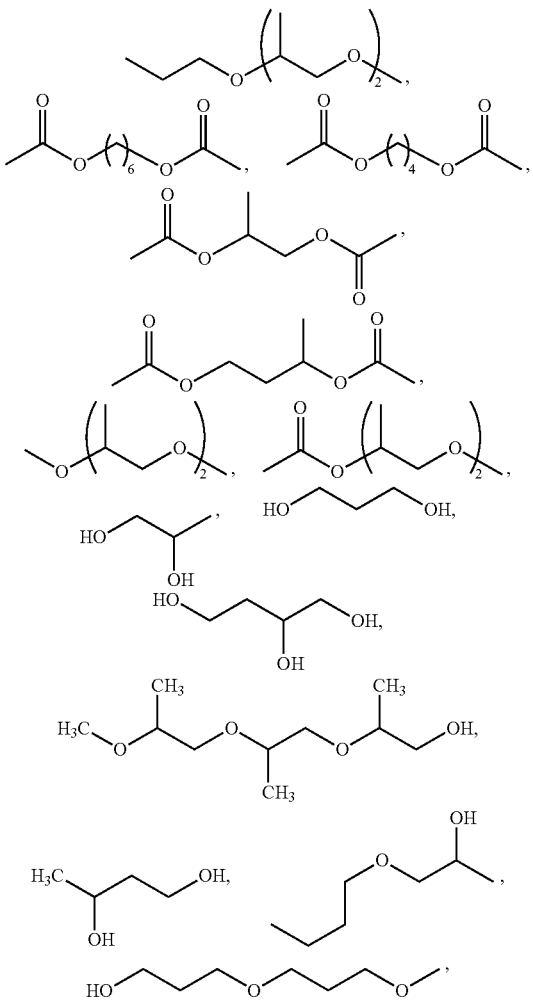

-continued

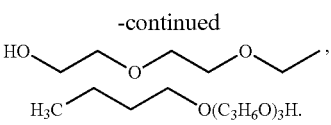

14. The method according to claim 13, wherein the developer comprises:
the enhancement additive; and
the first solvent.

15. The method according to claim 14, wherein the developer further comprises water at a concentration of 10 ppm to 250 ppm based on a total composition of the water, enhancement additive, and the first solvent.

16. The method according to claim 13, wherein a concentration of the second solvent having a boiling point of greater than 150° C. is 3 wt. % to 100 wt. % of the total weight of the second solvent and the first solvent.

17. The method according to claim 13, wherein the photoresist composition further comprises water at a concentration of 10 ppm to 250 ppm based on a total composition of the water, enhancement additive, and the first solvent.

18. The method according to claim 13, wherein a concentration of the ionic surfactant or non-ionic surfactant is 10 ppm to 1,000 ppm based on a total weight of the ionic surfactant or non-ionic surfactant and the first solvent.

19. The method according to claim 13, wherein the first solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

20. The method according to claim 13, wherein the one or more organic ligands are selected from the group consisting of a carboxylic acid, a sulfonic acid ligand, a methacrylic acid, and ligands including aliphatic or aromatic groups.

* * * * *